United States Patent
Kondo

(10) Patent No.: US 7,368,754 B2
(45) Date of Patent: May 6, 2008

(54) SEMICONDUCTOR INTEGRATED CIRCUIT, SIGNAL TRANSMITTING DEVICE, ELECTRO-OPTICAL DEVICE, AND ELECTRONIC APPARATUS

(75) Inventor: Takayuki Kondo, Suwa (JP)

(73) Assignee: Seiko Epson Corporation, Tokyo (JP)

(*) Notice: Subject to any disclaimer, the term of this patent is extended or adjusted under 35 U.S.C. 154(b) by 81 days.

(21) Appl. No.: 10/449,764

(22) Filed: Jun. 2, 2003

(65) Prior Publication Data
US 2004/0007709 A1 Jan. 15, 2004

(30) Foreign Application Priority Data
Jun. 10, 2002 (JP) .............. 2002-168404

(51) Int. Cl.
*H01L 21/00* (2006.01)
*H01L 33/00* (2006.01)

(52) U.S. Cl. ............. 257/80; 257/686; 257/82; 257/98; 257/99; 257/100; 257/E33.059; 372/46.01; 372/50.11

(58) Field of Classification Search ........... 257/80, 257/79, 78, 77, 81, 82, 98, 99, 100, E33.059, 257/E33.069, 686; 359/621, 622; 372/46.01, 372/50.11
See application file for complete search history.

(56) References Cited

U.S. PATENT DOCUMENTS

| | | | |
|---|---|---|---|
| 5,073,230 A | 12/1991 | Maracas et al. | |
| 5,124,543 A * | 6/1992 | Kawashima | 250/208.1 |
| 5,244,818 A | 9/1993 | Jokerst et al. | |
| 5,280,184 A | 1/1994 | Jokerst et al. | |
| 5,286,335 A | 2/1994 | Drabik et al. | |
| 5,391,257 A | 2/1995 | Sullivan et al. | |
| 5,401,983 A | 3/1995 | Jokerst et al. | |
| 5,465,009 A | 11/1995 | Drabik et al. | |
| 5,652,811 A * | 7/1997 | Cook et al. | 385/14 |
| 5,827,751 A | 10/1998 | Nuyen | |
| 5,966,108 A * | 10/1999 | Ditzik | 345/75.2 |
| 5,978,524 A * | 11/1999 | Bischel et al. | 385/4 |
| 5,985,693 A * | 11/1999 | Leedy | 438/107 |
| 6,033,995 A | 3/2000 | Muller | |
| 6,214,733 B1 | 4/2001 | Sickmiller | |
| 6,340,846 B1 * | 1/2002 | LoBianco et al. | 257/783 |
| 6,343,171 B1 | 1/2002 | Yoshimura et al. | |
| 6,381,072 B1 * | 4/2002 | Burger | 359/622 |
| 6,599,769 B2 * | 7/2003 | Kondo et al. | 438/28 |
| 2002/0118321 A1 * | 8/2002 | Ge | 349/73 |

FOREIGN PATENT DOCUMENTS

| | | |
|---|---|---|
| JP | A 6-151720 | 5/1994 |
| JP | A 6-151946 | 5/1994 |
| JP | A 7-30209 | 1/1995 |
| JP | A 9-503622 | 4/1997 |
| JP | 09-199795 | 7/1997 |
| JP | A 9-186240 | 7/1997 |

(Continued)

*Primary Examiner*—Thomas Dickey
*Assistant Examiner*—Fazli Erdem
(74) *Attorney, Agent, or Firm*—Oliff & Berridge, PLC

(57) ABSTRACT

The invention provides a semiconductor integrated circuit which allows a plurality of devices to be integrated compactly, that is, with high density; a signal transmitting device; an electro-optical device; and an electronic apparatus. A semiconductor integrated circuit includes tile-shaped microelements that are superimposed upon and adhered to the top surface of a substrate with an adhesive.

22 Claims, 19 Drawing Sheets

FOREIGN PATENT DOCUMENTS

| | | |
|---|---|---|
| JP | 09-223848 | 8/1997 |
| JP | 62-217673 | 9/1997 |
| JP | 11-052199 | 2/1999 |
| JP | A 2000-114581 | 4/2000 |
| JP | A-2002-026440 | 1/2002 |

* cited by examiner

SEMICONDUCTOR INTEGRATED CIRCUIT, SIGNAL TRANSMITTING DEVICE, ELECTRO-OPTICAL DEVICE, AND ELECTRONIC APPARATUS

BACKGROUND OF THE INVENTION

1. Field of Invention

The present invention relates to a semiconductor integrated circuit, a signal transmitting device, an electro-optical device, and an electronic apparatus. More particularly, the present invention relates to a semiconductor integrated circuit including a plurality of tile-shaped microelements superimposed upon and bonded to each other, a signal transmitting device, an electro-optical device, and an electronic apparatus.

2. Description of Related Art

Related art technologies of forming a semiconductor device on a substrate formed of a different material include: disposing a gallium arsenide surface emitting laser (VCSEL), a photodiode (PD), a high electron mobility transistor (HEMT), or the like, on a silicon semiconductor substrate; and bonding a very-small silicon transistor, instead of a thin-film transistor (TFT) provided for a corresponding pixel of a liquid crystal display (LCD), to a glass substrate.

An example of an integrated circuit involving the use of different semiconductor materials is an optoelectronic integrated circuit (OEIC). An optoelectronic integrated circuit includes an inputting/outputting device using light. Although signal processing in an integrated circuit is performed using electric signals, input/output operations outside the integrated circuit are performed using light signals.

SUMMARY OF THE INVENTION

In related art computers, since the internal structure of an integrated circuit can be made to be finer, the internal operating speed (operating clock) of a central processing unit (CPU) can be increased. However, in the related art, the signal transmission speed in a bus has substantially reached its limit, which is a bottleneck in the processing speed of computers. If the signal transmission in the bus can be carried out using light signals, it is possible to considerably increase the limit of the processing speed of computers. In order to achieve this, it is necessary for silicon integrated circuits to incorporate very small light emitters/light receivers.

However, since silicon cannot emit light because it is an indirect semiconductor, it is necessary to form an integrated circuit by combining silicon with a semiconductor light emitter that is different from silicon.

A related art semiconductor light emitter that may be advantageous is a surface emitting laser (VCSEL) formed of a compound semiconductor, such as gallium arsenide (GaAs). However, for a surface emitting laser, lattice matching cannot be achieved with silicon, so that it is very difficult to form the surface emitting laser directly in a silicon integrated circuit by a semiconductor process such as an epitaxy process.

Ordinarily, a surface emitting laser is formed on a gallium arsenide substrate. Accordingly, a method of fusing an electric signal transmitting circuit and a light signal transmitting circuit by forming a surface emitting laser disposed on a gallium arsenide substrate into a chip and mechanically mounting the chip to a silicon integrated circuit substrate may be used.

Unlike an end emitting laser which emits light from a side surface formed by cutting a wafer, a surface emitting laser emits light from a semiconductor front surface. Therefore, in the related art, it has not been possible to form a surface emitting laser and an automatic power control (APC) circuit, which receives a portion of light emitted from the surface emitting laser and automatically controls the amount of light emission, on the same substrate. Consequently, in the related art, in order to form an APC circuit in a surface emitting laser, it has been necessary to use a plurality substrates (structural members), thereby increasing the size of the surface emitting laser and complicating the production process, so that production costs are increased.

In the related art, wavelength division multiplexing (WDM) optical communication to transmit a plurality of laser beams having different wavelengths using one optical fiber is carried out. In the related art WDM optical communication, a plurality of laser beams from light-emitting sources, such as surface emitting lasers which emit laser beams having different wavelengths, are synthesized by an optical multiplexer, including, for example, a waveguide, and the synthesized light beams impinge upon the one optical fiber.

Although a plurality of surface emitting lasers can be formed on one substrate, a plurality of surface emitting lasers having different wavelengths cannot be formed on the one substrate, so that laser beams having one wavelength are only emitted on one substrate. To address or overcome this problem, in the related art WDM optical communication, since the light-emitting sources are formed on a plurality of substrates used for the surface emitting lasers, the light-emitting sources and the optical multiplexer become relatively large, and the positions of the plurality of substrates and the optical multiplexer need to be aligned, thereby complicating the production process.

The present invention addresses the above and/or other circumstances, and provides a semiconductor integrated circuit which allows a plurality of devices to be integrated compactly, that is, with high density; a signal transmitting device; an electro-optical device; and an electronic apparatus.

The present invention also provides a semiconductor integrated circuit which allows a surface emitting laser and an APC circuit to be disposed on the same substrate; a signal transmitting device; an electro-optical device; and an electronic apparatus.

The present invention also provides a semiconductor integrated circuit which allows a plurality of light-emitting devices having different light-emission wavelengths to be disposed on one substrate; a signal transmitting device; an electro-optical device; and an electronic apparatus.

Thus, the invention provides a semiconductor integrated circuit including a plurality tile-shaped microelements that are superimposed upon and affixed to a substrate.

According to the present invention, since each tile-shaped microelement functions as an electronic device or an optical device, devices having any function can be three-dimensionally combined, so that the semiconductor integrated circuit can be made to be more compact.

Here, each tile-shaped microelement may be a compound semiconductor or a silicon semiconductor. The substrate to which the tile-shaped microelements are affixed may be a silicon semiconductor substrate or a compound semiconductor substrate. Therefore, it is possible to very compactly form a hybrid substrate having a compound semiconductor and a silicon semiconductor combined three-dimensionally. This cannot be done in the related art using one monolithic substrate.

In the semiconductor integrated circuit, it is desirable that the plurality of tile-shaped microelements be affixed to the substrate with an adhesive that is at least one of insulative and transparent.

According to the present invention, by using an insulating adhesive, it is possible to, for example, reduce or prevent short-circuiting of a metal wiring which electrically connects electronic devices, formed as tile-shaped microelements, and an electric circuit, formed on the substrate. In addition, according to the present invention, when, for example, a light emitter and a light receiver are formed as tile-shaped microelements, it is possible to reduce or prevent interception of emitted or incident light from the tile-shaped microelements by the adhesive.

In the semiconductor integrated circuit, it is desirable that one of the tile-shaped microelements function differently from another tile-shaped microelement.

According to the present invention, it is possible to form one semiconductor integrated circuit including a plurality of devices with different functions compactly combined three dimensionally. This cannot be done using one monolithic substrate.

In the semiconductor integrated circuit, it is desirable that at least one of the tile-shaped microelements be a light emitter, and at least one other tile-shaped microelement be a light receiver.

According to the present invention, it is possible to very compactly form a semiconductor integrated circuit comprising a combination of a light emitter and a light receiver.

In the semiconductor integrated circuit of the present invention, it is desirable that the at least one light emitter be either a surface emitting laser or a light-emitting diode.

In the semiconductor integrated circuit of the present invention, it is desirable that the at least one light receiver be a photodiode.

According to the present invention, it is possible to very compactly form a semiconductor integrated circuit comprising a combination of a surface emitting laser and a photodiode. This cannot be done using one monolithic substrate.

In the semiconductor integrated circuit of the present invention, it is desirable that a light-receiving section of the at least one light receiver be disposed on an emission axis of the at least one light emitter.

According to the present invention, light from the at least one light emitter can be received by the at least one light receiver that is superimposed upon and affixed to the at least one light emitter.

In the semiconductor integrated circuit of the present invention, it is desirable that the at least one light receiver receive a portion of light emitted from the at least one light emitter and detect the amount of received light.

According to the present invention, it is possible to very compactly form the at least one light emitter and the at least one light receiver, which detects light from the at least one light emitter, on one semiconductor substrate. If, for example, the at least one light emitter is a surface emitting laser, it is possible to very compactly form the at least one surface emitting laser and light receiver, which detects the output from the at least one surface emitting laser, on one semiconductor substrate.

It is desirable that the semiconductor integrated circuit further include an automatic power control circuit to control the amount of light emitted from the at least one light emitter based on the amount of received light detected by the at least one light receiver.

According to the present invention, it is possible to very compactly form on one substrate the at least one light emitter having an automatic power control circuit to automatically control the amount of emitted light. Therefore, regardless of any change in the ambient temperature and changes in the components with time, it is possible to very compactly form the at least one light emitter which stably outputs a desired amount of light for a long period of time.

In the semiconductor integrated circuit of the present invention, it is desirable to dispose a multi-film reflective layer on at least one surface of the at least one light receiver.

According to the present invention, since the multi-film reflective layer does not reflect light having a predetermined wavelength (for example, the light emitted from the at least one light emitter), it is possible to reduce noise caused by reflected light (returning light) from the at least one light receiver.

In the semiconductor integrated circuit of the present invention, it is desirable that the reflectance ratio of the multi-film reflective layer of the at least one light receiver with respect to the light from the at least one light emitter be equal to or less than ten percent.

In the semiconductor integrated circuit, it is desirable that a surface, opposite to a light-receiving surface of the at least one light receiver, of the at least one light receiver be covered with a nontransparent material.

According to the present invention, since the reflected light (returning light) from both surfaces of the at least one light receiver can be reduced, it is possible to further reduce noise caused by the reflected light.

In the semiconductor integrated circuit, it is desirable that the substrate be a transparent substrate, the at least one surface emitting laser be affixed to the top surface of the transparent substrate with a transparent adhesive, the at least one photodiode be adhered to the top surface of the at least one surface emitting laser with a transparent adhesive, and the material cover the top surface of the at least one photodiode.

According to the present invention, for example, light that has been emitted from the at lest one surface emitting laser and transmitted through the at least one photodide can be absorbed by a nontransparent material disposed on the upper surface of the at lest one fhotodiode, so that it is possible to reduce stray light and noise caused by returning light.

In the semiconductor integrated circuit, it is desirable that the at least one photodiode be affixed to at least the top surface of the substrate with a nontransparent adhesive the at least one surface emitting laser be affixed to the top surface of the at least one photodiode with a transparent adhesive, and a transparent protective material cover the top surface of at least one surface emitting laser.

According to the present invention, for example, light that has been emitted from the at lest one surface emitting laser and transmitted through the at least one photodiode be absorbed by a nontransparent adhesive disposed on the lower surface of the photodiode, so that it is possible to reduce stray light and noise caused by returning light.

In the semiconductor integrated circuit, it is desirable that the tile-shaped microelements be light emitters having different emission wavelengths.

According to the present invention, it is possible to three-dimensionally combine a plurality of light emitters which emit light having different wavelengths, so that a plurality of light emitters which emit light having different wavelengths can be compactly formed in the semiconductor integrated circuit.

In the semiconductor integrated circuit, it is desirable that the light emitters be surface emitting lasers, and are disposed so that the optical axes of the surface emitting laser do not coincide.

According to the present invention, a plurality of surface emitting lasers emitting laser beams having different wavelengths, which cannot be formed on one monolithic substrate, can be three-dimensionally combined and very compactly formed on one substrate.

In the semiconductor integrated circuit, it is desirable that the tile-shaped microelements each include a laser structural section, which functions as the surface emitting laser, and a veruy-small tile-shaped section, which is joined to the laser structural section, and that the very-small tile-shaped section of each tile-shaped microelement be transparent to the light from the surface emitting laser of another tile-shaped microelement.

According to the present invention, since laser beams from the surface emitting laser of each tile-shaped microelement are transmitted through the very-small tile-shaped section of another tile-shaped microelement, gaps between the surface emitting lasers of the tile-shaped microelements can be made very small. Therefore, a plurality of surface emitting lasers which emit laser beams having different wavelengths can be formed even more compactly.

In the semiconductor integrated circuit, it is desirable that the tile-shaped microelements each include a laser structural section, which functions as the surface emitting laser, and a very-small tile-shaped section, which is joined to the laser structural section, and that the very-small tile-shaped section of each tile-shaped microelement be transparent to the light from the surface emitting laser of the same tile-shaped microelement.

According to the present invention, light beams emitted towards the very-small tile-shaped section (lower side) of one surface emitting laser, formed as a tile-shaped microelement, can be transmitted through the very-small tile-shaped section, so that a plurality of surface emitting lasers which emit laser beams having different wavelengths not only towards the upper side but also towards the lower side of the surface emitting laser can be compactly formed.

In the semiconductor integrated circuit, it is desirable that the tile-shaped microelements are each formed by disposing a semiconductor device on a semiconductor substrate and peeling off only a functional layer, which is a layer on a surface of the semiconductor substrate and which has the semiconductor device disposed thereon, from the semiconductor substrate.

According to the present invention, a semiconductor device separated as a tile-shaped microelement from a semiconductor substrate can be joined to any object (substrate) to form an integrated circuit.

Here, the semiconductor device may be a compound semiconductor device or a silicon semiconductor device. The object (substrate) to which the semiconductor device is joined may be, for example, a silicon semiconductor substrate or a compound semiconductor substrate. Therefore, according to the present invention, it is possible to form a semiconductor device on a substrate formed of a material that differs from the material of the semiconductor device, such as forming, for example, a gallium arsenide surface emitting laser or photodiode on a silicon semiconductor substrate. In addition, since the semiconductor device is completed on the semiconductor substrate, and then separated in the shape of a very-small tile, it is possible to test and sort semiconductor devices prior to forming integrated circuits.

In the semiconductor integrated circuit, it is desirable that the tile-shaped microelements are each formed by disposing a semiconductor device on a semiconductor substrate; affixing a film adjacent to a surface, where the semiconductor device is formed, of the semiconductor substrate; and separating a functional layer, which has the semiconductor device disposed thereon, from the semiconductor substrate.

According to the present invention, it is possible to separate only a function layer, which has a semiconductor device disposed thereon, as a tile-shaped microelement from a semiconductor substrate, to mount the tile-shaped microelement to a film, and to handle it. Therefore, a semiconductor device (tile-shaped microelement) can be separately selected and finally joined to a final substrate, and the size of the tile-shaped microelement that can be handled can be made smaller than a tile-shaped microelement formed by a related art mounting technology.

According to the present invention, there is provided a signal transmitting device comprising any one of the above-described semiconductor integrated circuits, a lens to focus the light emitted from of the surface emitting lasers disposed in the semiconductor integrated circuit, and an optical fiber upon which the emitted light focused by the lens impinges.

According to the present invention, since a plurality of laser beams having different wavelengths emitted from a plurality of surface emitting lasers are modulated using transmission signals, it is possible to form a wavelength division multiplexing (WDM) optical communication device. In the wavelength division multiplexing (WDM) optical communication device, since a plurality of laser beams can enter one optical fiber using only a lens, it becomes unnecessary to use an optical multiplexer as in a related art wavelength division multiplexing (WDM) optical communication device, and to align the position of each light-emitting source and the optical multiplexer, so that it is possible to easily produce the communication device, and to reduce the size of the communication device.

In the signal transmitting device, it is desirable that an optical system be a reduction optical system with respect to the emitted light, with the optical system including the semiconductor integrated circuit, the lens, and the optical fiber, which are arranged in terms of the focal length of the lens.

An electro-optical device of the present invention includes any one of the above-described semiconductor integrated circuits.

According to the present invention, for every pixel of a liquid crystal display, a plasma display, or an organic electro-luminescence (EL) display (which are electro-optical devices), it is possible to superimpose and adhere a tile-shaped microelement, such as a silicon transistor, a resistor, or a capacitor, instead of a thin-film transistor (TFT), which is usually used as a driving transistor, a resistor, or a capacitor. Therefore, compared to the case where a TFT is used, it is possible to provide a highly efficient switching function and to change a display state with high speed.

An electronic apparatus of the present invention includes the electro-optical device.

According to the present invention, it is possible to compactly form an electronic apparatus including a displaying device which can change its display state with high speed.

An electronic apparatus of the present invention includes any one of the above-described semiconductor integrated circuits.

According to the present invention, it is possible to reduce the size of the electronic apparatus, to perform signal processing at a higher speed, and to reduce production costs of the electronic apparatus.

DETAILED DESCRIPTION OF PREFERRED EMBODIMENTS

A description of a semiconductor integrated circuit of the present invention is provided below with reference to the drawings.

First Exemplary Embodiment

Figure 1:
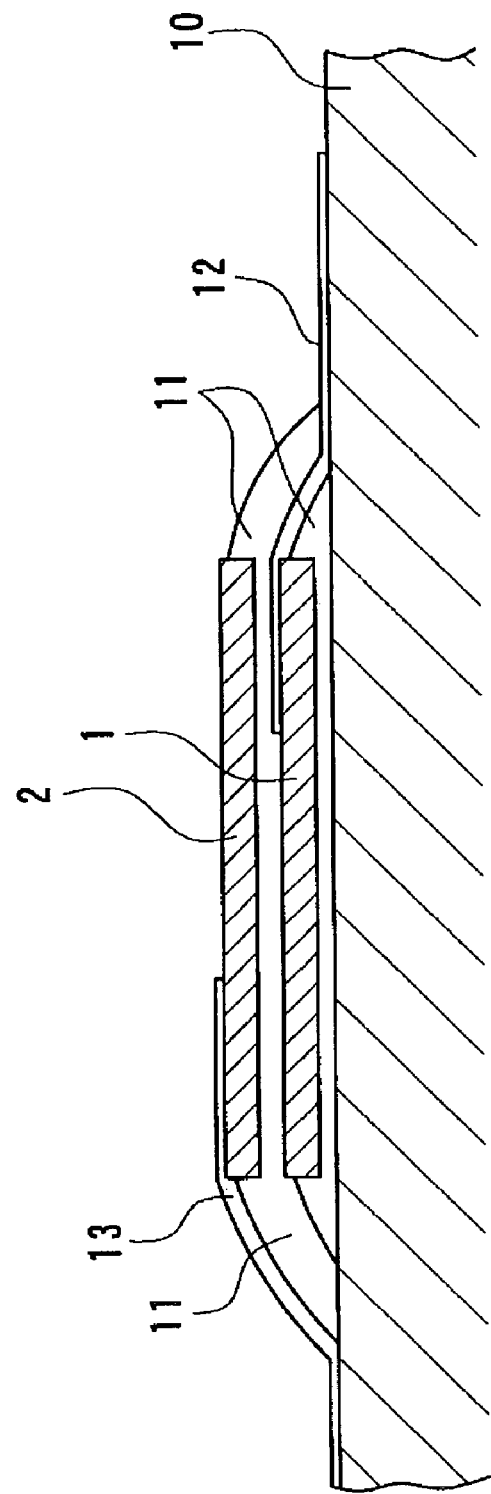
FIG. 1 is a schematic sectional view of a semiconductor integrated circuit of a first exemplary embodiment.

FIG. 1 is a schematic sectional view of a semiconductor integrated circuit of the first exemplary embodiment. The semiconductor integrated circuit shown in FIG. 1 is formed using a substrate 10 and tile-shaped microelements 1 and 2.

The tile-shaped microelements 1 and 2 are very-small tile-shaped semiconductor devices, which are square (plate-shaped) members having, for example, a thickness of from 1 μm to 20 μm and horizontal and vertical sizes of from a few tens of micrometers (μm) to a few hundred micrometers (μm). A method for producing the tile-shaped microelements 1 and 2 is described below. The tile-shaped microelements 1 and 2 are not limited to having a square shape, so that they may have other shapes.

The tile-shaped microelements 1 and 2 are superimposed upon and bonded to each other with an adhesive 11, and are adhered to one surface of the substrate 10 with the adhesive 11. The tile-shaped microelements 1 and 2 have various devices (not shown), such as light emitters, light receivers, transistors, or diodes. The devices of the tile-shaped microelements 1 and 2 and an electric circuit on the substrate 10 are connected with metal wirings 12 and 13.

It is desirable that the adhesive 11 be formed of, for example, resin, and be insulative and transparent. By making the adhesive 11 insulative, it is possible to reliably reduce or prevent short-circuiting at the metal wirings 12 and 13.

It is desirable that the tile-shaped microelements 1 and 2 have devices with different functions. For example, the following combinations are possible:

1) The tile-shaped microelement 1 has a light emitter and the tile-shaped microelement 2 has a light receiver, 2) The tile-shaped microelement 1 has a light emitter which emits light having a wavelength of $\lambda_1$, and the tile-shaped microelement 2 has a light emitter which emits light having a wavelength of $\lambda_2$, 3) The tile-shaped microelement 1 has a light receiver which detects light having a wavelength of $\lambda_1$, and the tile-shaped microelement 2 comprises a light receiver which detects light having a wavelength of $\lambda_2$, and 4) The tile-shaped microelement 1 has a transistor, and the tile-shaped microelement 2 has a diode.

Examples of the light emitter are a gallium arsenide surface emitting laser (VCSEL) and a light-emitting diode (LED). An example of the light receiver is a photodiode (PD). Examples of the transistor are a high electron mobility transistor (HEMT) and HTB. Each tile-shaped microelement may have, for example, a resistor or a capacitor. The resistor or capacitor alone may be formed as a tile-shaped microelement.

Figure 2:
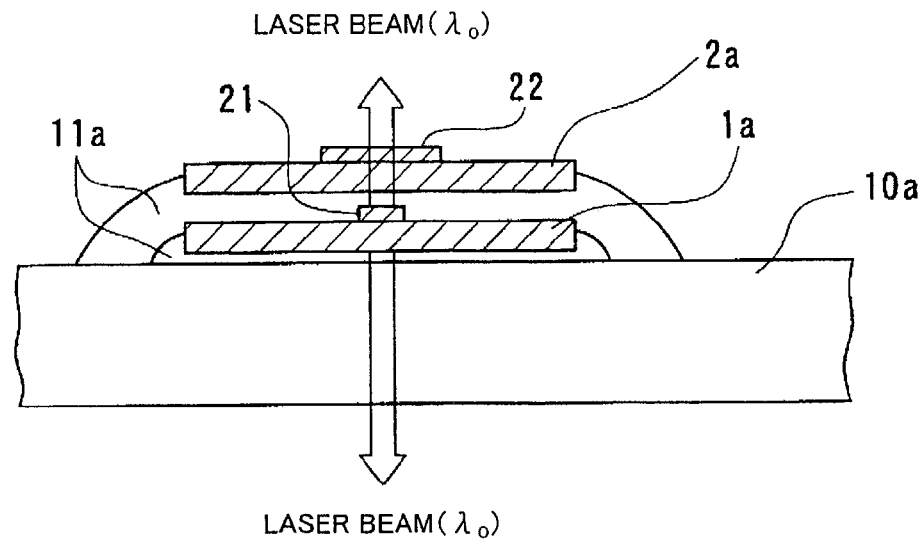
FIG. 2 is a schematic sectional view of a specific example of the semiconductor integrated circuit.

A specific form of the exemplary embodiment is described below with reference to FIG. 2. FIG. 2 is a schematic sectional view of a specific form of the exemplary embodiment of the semiconductor integrated circuit. In the specific form, a light emitter (surface emitting laser) and a light receiver (photodiode), which are used as the tile-shaped microelements 1 and 2 shown in FIG. 1, are superimposed upon and bonded to each other.

More specifically, the semiconductor integrated circuit is formed using a transparent substrate 10a, a tile-shaped microelement 1a having a surface emitting laser 21, and a tile-shaped microelement 2a having a photodiode 22. An adhesive 11a used to bond the substrate 10a, the tile-shaped microelement 2a, and the tile-shaped microelement 11a is transparent and insulative. The arrangement of the tile-shaped microelement 1a and the tile-shaped microelement 2a may be reversed.

The surface emitting laser 21 on the tile-shaped microelement 1a emits laser beams having a wavelength of $\mu_0$ towards the substrate 10a and towards the tile-shaped microelement 2a. The photodiode 22 on the tile-shaped microelement 2a is disposed on an emission axis of the surface emitting laser 21. Therefore, the laser beams having a wavelength of $\mu_0$ emitted towards the tile-shaped microelement 2a are incident upon the photodiode 22. The photodiode 22 detects an output of the laser beams (that is, the amount of emitted light) having a wavelength of $\mu_0$ from the surface emitting laser 21.

The laser beams having a wavelength of $\mu_0$ emitted towards the substrate 10a are transmitted through the transparent substrate 10a and are used for, for example, communication signals.

Figure 3:
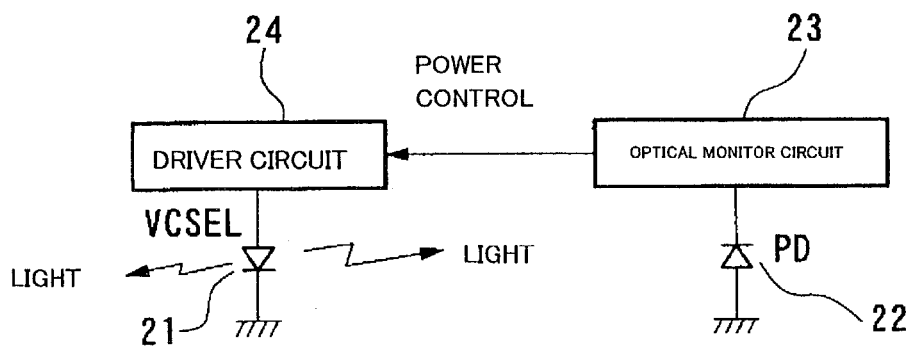
FIG. 3 is a schematic showing an automatic power control circuit of a surface emitting laser in the semiconductor integrated circuit.

An example of the structure of a surface emitting laser with an automatic power control (APC) circuit used in the above-described semiconductor integrated circuit is described below with reference to FIG. 3. FIG. 3 is a schematic showing the automatic power control circuit of the surface emitting laser.

Some of the laser beams from the surface emitting laser 21 on the tile-shaped microelement 1a impinge upon the photodiode 22 on the tile-shaped microelement 2a, causing electric current corresponding to the output of the laser beams from the surface emitting laser 21 to flow through the photodiode 22. An optical monitor circuit 23 outputs to a driver circuit 24 a power control signal corresponding to the magnitude of the electric current flowing through the photodiode 22. The optical monitor circuit compares a predetermined standard value and the magnitude of the electric current flowing through the photodiode 22, and generates a power control signal so that the electric current becomes a desired constant value, that is, so that the output of laser beams from the surface emitting laser 21 becomes a desired constant value. The driver circuit drives the surface emitting laser 21 so that the laser output becomes a value corresponding to the power control signal.

By this, the laser output from the surface emitting laser 21 is maintained at the desired constant value regardless of, for example, changes in the ambient temperature and changes with time.

By disposing the optical monitor circuit 23 and the driver circuit 24 at the substrate 10a and at the respective tile-shaped microelement 2a and the tile-shaped microelement 1a, the surface emitting laser and the automatic power control (APC) circuit can be disposed on one substrate. Therefore, it is possible to considerably reduce the size of the surface emitting laser and to simplify the production process, thereby reducing production costs.

Figure 4:
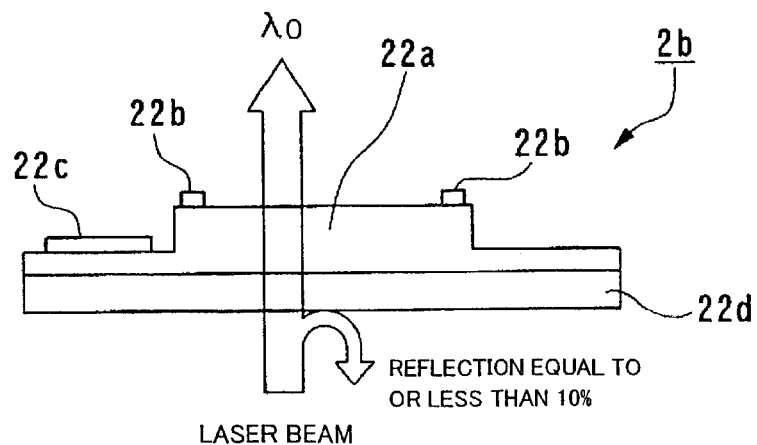
FIG. 4 is a schematic sectional view of a modification of a tile-shaped microelement in the semiconductor integrated circuit.

Next, an example of the structure for reducing noise caused by reflected light (returning light) from the tile-shaped microelement 2a having the photodiode 22 in the semiconductor integrated circuit is described below with reference to FIGS. 4 to 7. FIG. 4 is a schematic sectional view of a modification of the tile-shaped microelement 2a in the semiconductor integrated circuit shown in FIG. 2.

The tile-shaped microelement 2a includes a photodiode receiver 22a, first electrodes 22b, a second electrode 22c, and a multi-film reflective layer 22d. The photodiode receiver 22a is disposed on one surface (upper surface) of a tile-shaped member that forms the tile-shaped microelement 2a. The first electrodes 22b are disposed at the peripheral ends of the upper surface of the photodiode receiver 22a. The second electrode 22c is formed in the same plane as the photodiode receiver 22a in the tile-shaped member. The multi-film reflective layer 22d is disposed on the other surface (lower surface) of the tile-shaped member.

The multi-film reflective layer 22d has wavelength selectivity, and has a reflectance ratio equal to or less than 10 percent with respect to the laser beams having a wavelength of $\mu_0$ emitted from the surface emitting laser 21 on the tile-shaped microelement 1a so that it acts as an anti-reflection film with respect to the laser beams having a wavelength $\lambda_0$.

Therefore, by disposing the multi-film reflective layer 22d in the tile-shaped microelement 2a, the reflection of the laser beams having a wavelength $80_0$ by the tile-shaped microelement 2a can be reduced, thereby making it possible to reduce noise.

The multi-film reflective layer 22d may be disposed on the upper surface instead of on the lower surface of the tile-shaped member.

Figure 5:
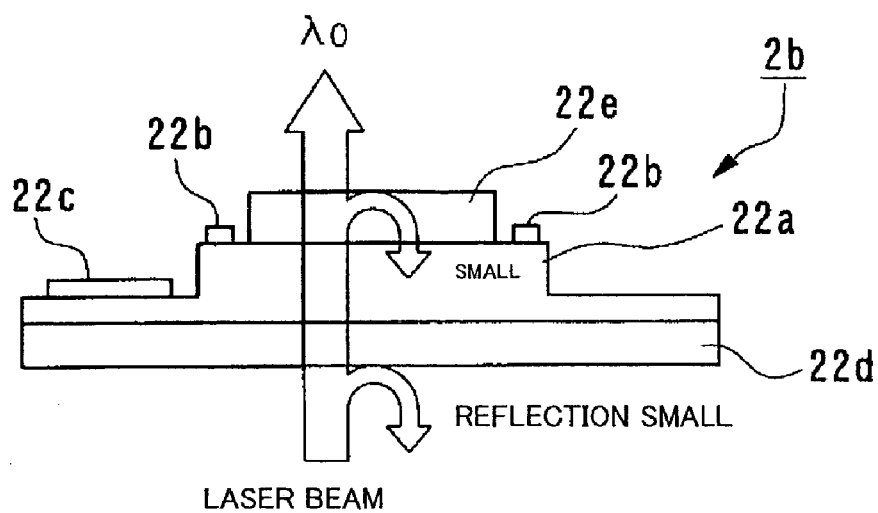
FIG. 5 is a schematic sectional view of an exemplary modification of the tile-shaped microelement in the semiconductor integrated circuit.

FIG. 5 is a schematic sectional view of a tile-shaped microelement 2b, which is an enhancement of the tile-shaped microelement 2a shown in FIG. 4. The difference between the tile-shaped microelements 2b and 2a is that a multi-film reflective layer 22e is disposed in the tile-shaped microelement 2b. The multi-film reflective layer 22e is disposed surface of a photodiode light receiver 22a.

By this structure, the tile-shaped microelement 2b can restrict reflection of the laser beams (having a wavelength of $\lambda_0$) from the tile-shaped microelement 1a, not only at the lower surface but also at the upper surface of the tile-shaped microelement 2b, thereby making it possible to further reduce noise.

Figure 6:
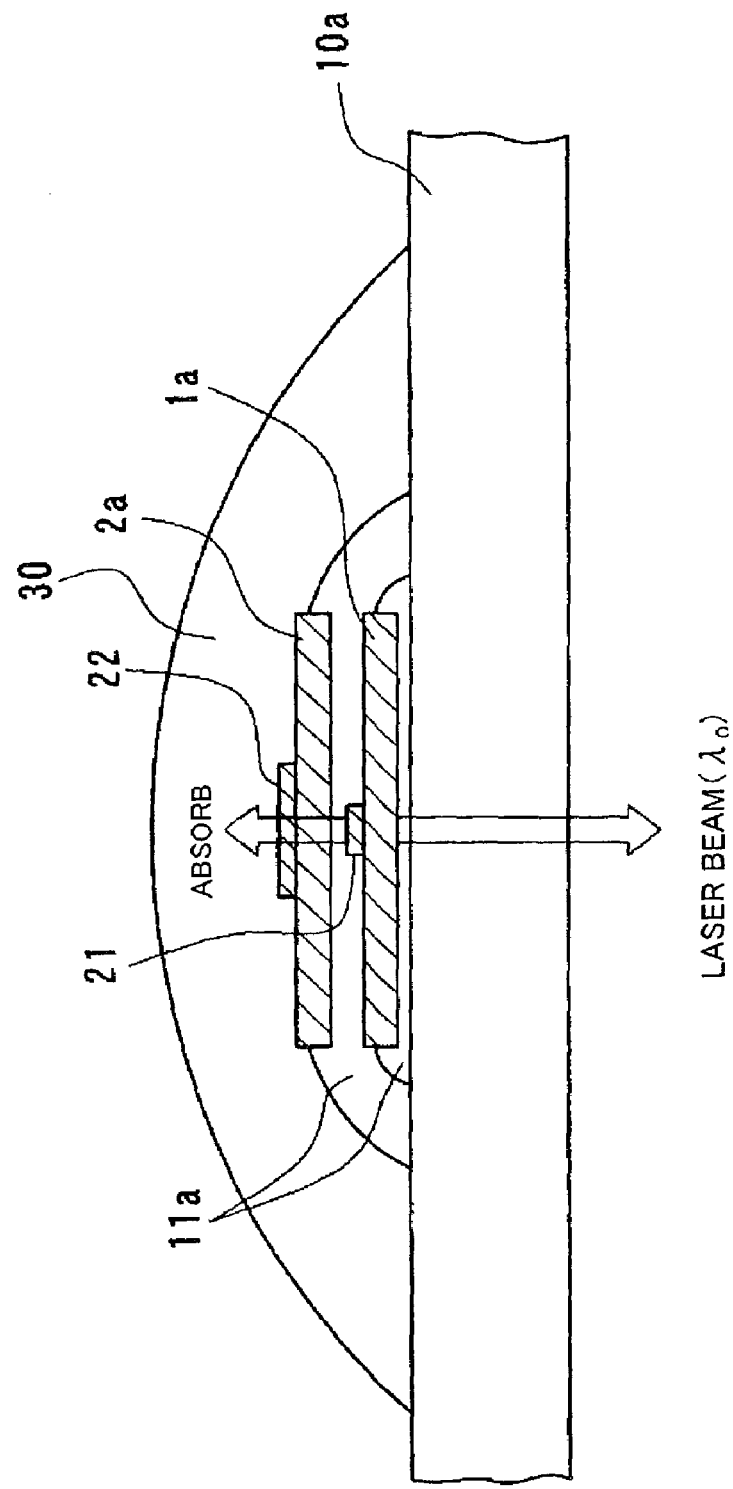
FIG. 6 is a schematic sectional view of an exemplary modification of the semiconductor integrated circuit.

FIG. 6 is a schematic sectional view of a modification of the semiconductor integrated circuit shown in FIG. 2. The difference between the semiconductor integrated circuit shown FIG. 6 and the semiconductor integrated circuit shown in FIG. 2 is that a nontransparent material 30 is disposed in the semiconductor integrated circuit shown in FIG. 6. More specifically, the nontransparent material 30 is disposed so as to cover the upper surface of a tile-shaped microelement 2a having a photodiode 22 formed thereon.

By this structure, laser beams (having a wavelength of $\lambda_0$) transmitted trough the tile-shaped microelement 2a among light beams emitted from a surface emitting laser 21 on a tile-shaped microelement 1a are absorbed by the nontransparent material 30. Therefore, it is possible to considerably reduce stray light that is produced by the laser beams that are transmitted through the tile-shaped microelement 2a, so that noise caused by an be further reduced.

Next, a method of forming the nontransparent material 30 is described below. For the nontransparent material 30, a mixture of resin with a pigment, such as carbon black, may be used. When resin is used for the nontransparent material 30, any one of an inkjet method, a dispenser method, a spin coating method, a roll coating method, and a printing method may be used as the coating method.

It is desirable that the nontransparent material 30 be insulative.

Figure 7:
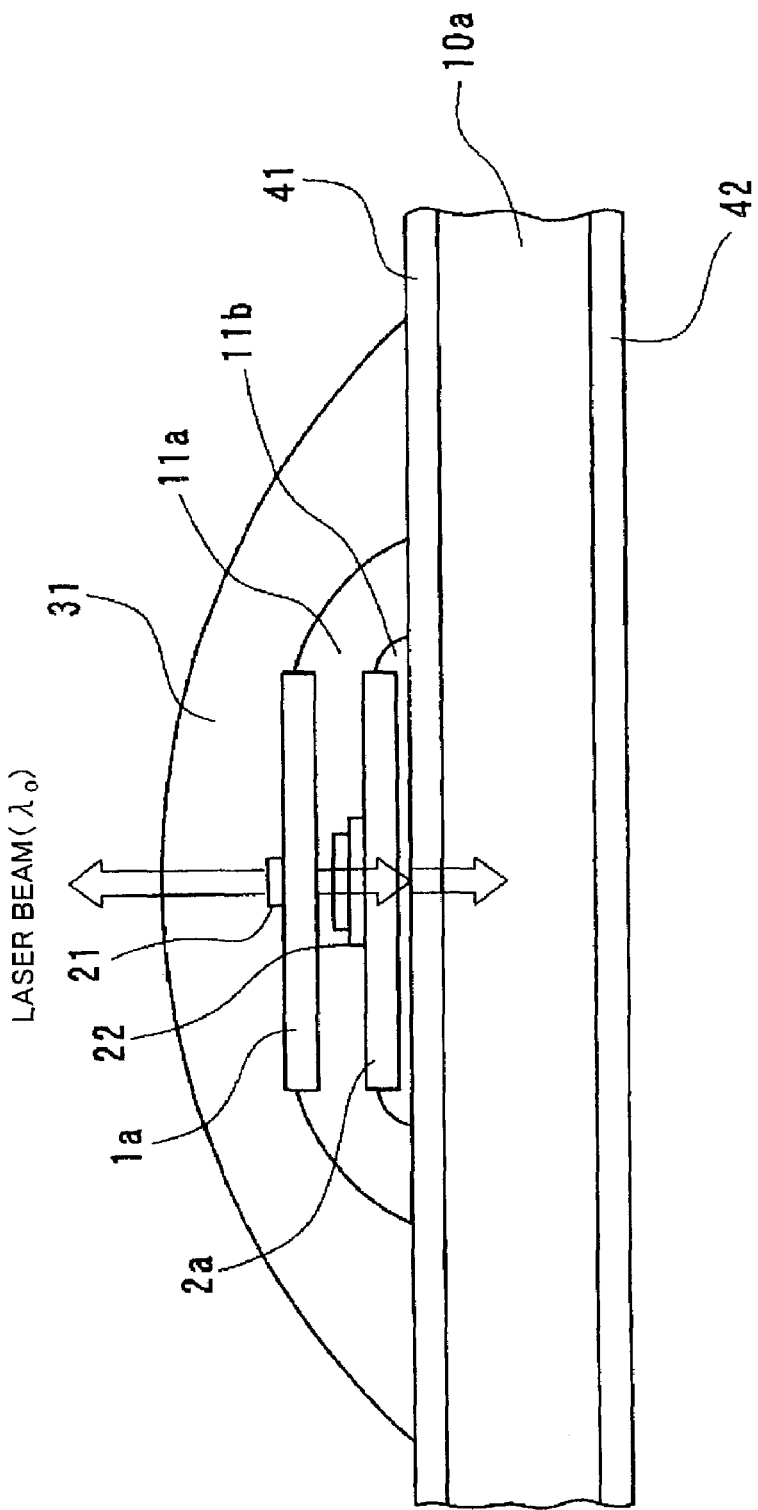
FIG. 7 is a schematic sectional view of another exemplary modification of the semiconductor integrated circuit.

FIG. 7 is a schematic sectional view of a modification of the semiconductor integrated circuit shown in FIG. 6. The differences between the semiconductor integrated circuit shown in FIG. 7 and the semiconductor integrated circuit shown in FIG. 6 are that, in the semiconductor integrated circuit shown in FIG. 7, the vertical arrangement of a tile-shaped microelement 1a and a tile-shaped microelement 2a is reversed; that a transparent protective layer 31 covers the top surface of the tile-shaped microelement 1a on which a surface emitting laser 21 is disposed; that the tile-shaped microelement 2a and a substrate 10a are adhered to each other with a nontransparent adhesive 11b; and that antireflection layers 41 and 42 are provided on the respective top and bottom surfaces of the substrate 10a. If the substrate 10 is formed of a nontransparent material, it is not necessary to dispose the antireflection layer on the bottom surface of the substrate 10. A light-absorbing layer may be disposed on the bottom surface of the substrate 10 instead of the nonreflection layer.

The transparent protective layer 31 may be formed by the same method as the nontransparent material 30.

Accordingly, in the semiconductor integrated circuit, laser beams (having a wavelength of $\lambda_0$) are radiated upwardly of the substrate 10a in FIG. 7, which is in a direction opposite to the direction in which the laser beams are radiated in the semiconductor integrated circuit shown in FIG. 6. As in the semiconductor integrated circuit shown in FIG. 6, it is possible to considerably reduce stray light that is produced by laser beams transmitted through the tile-shaped microelement 2a, so that noise caused by returning light can be further reduced.

Second Exemplary Embodiment

Next, a description of the second exemplary embodiment of the present invention is provided below with reference to FIGS. 8 to 12.

In the exemplary embodiment, two tile-shaped microelements, which are superimposed upon and bonded to a substrate, have respective light emitters having different light emission wavelengths disposed thereon.

Figure 8:
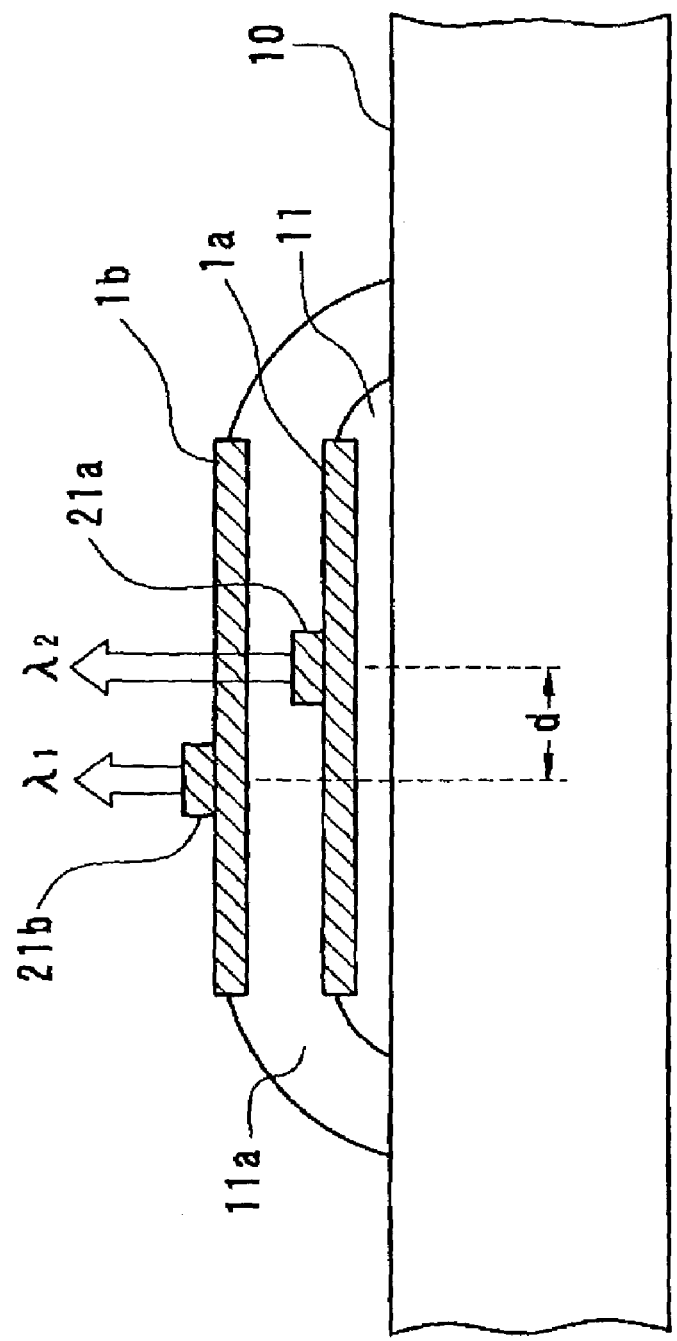
FIG. 8 is a schematic sectional view of a semiconductor integrated circuit of a second exemplary embodiment.

FIG. 8 is a schematic sectional view of a semiconductor integrated circuit of the second exemplary embodiment. The semiconductor integrated circuit shown in FIG. 8 is formed using substrate 10, a tile-shaped microelement 1a, and a tile-shaped microelement 1b.

Like the tile-shaped microelement 1 shown in FIG. 1, the tile-shaped microelement 1a and the tile-shaped microelement 1b have the shape of very small tiles (plates). A surface emitting laser 21a which emits laser beams (having a wavelength of $\lambda_2$) is disposed on the tile-shaped microelement 1a, and a surface emitting laser 21b which emits laser beams (having a wavelength of $\lambda_1$) is disposed on the tile-shaped microelement 1b. The tile-shaped microelement 1a and the tile-shaped microelement 1b are superimposed upon and adhered to one surface of the substrate 10.

The emission axis of the surface emitting laser 21a on the tile-shaped microelement 1a and the emission axis of the surface emitting laser 21b on the tile-shaped microelement 1b do not coincide, so that they are separated from each other by a predetermined distance "d". If the emission axes coincide, and, for example, the light emitting laser 21a alone emits laser beams, the laser beams impinge upon the surface emitting laser 21b and excite the surface emitting laser 21b, so that laser beams are also emitted from the surface emitting laser 21b. To prevent or substantially prevent this, the emission axes are each other.

The tile-shaped microelement 1a is adhered to the substrate 10 with an adhesive 11, and the tile-shaped microelement 1b is adhered to the tile-shaped microelement 1a with and adhesive 11a.

The substrate 10 may be either a transparent substrate or a nontransparent substrate 10 is a transparent substrate which allows laser beams to be transmitted though and to exit from the substrate 10 (lower surface laser radiation), a transparent adhesive is used for the adhesive 11. In contrast, if the substrate 10 is to allow laser beams to exit away from it (upward) as viewed from the tile-shaped microelement 1a (upper surface laser radiation), a nontransparent adhesive is used for the adhesive 11. A transparent adhesive is used for the adhesive 11 a to bond the tile-shaped microelements 1a and 1b together.

In the above-described semiconductor integrated circuit, although two tile-shaped microelement are superimposed upon and bonded to each other, three or more of them may be superimposed upon and bonded to each other.

By virtue of this structure, in the semiconductor integrated circuit shown in FIG. 8, a plurality of light emitters (surface emitting lasers) having different light emission wavelengths can be disposed, and the distance between the emission axes of the respective light emitters can be made very-small to, for example, a few tens of micrometers.

Figure 9:
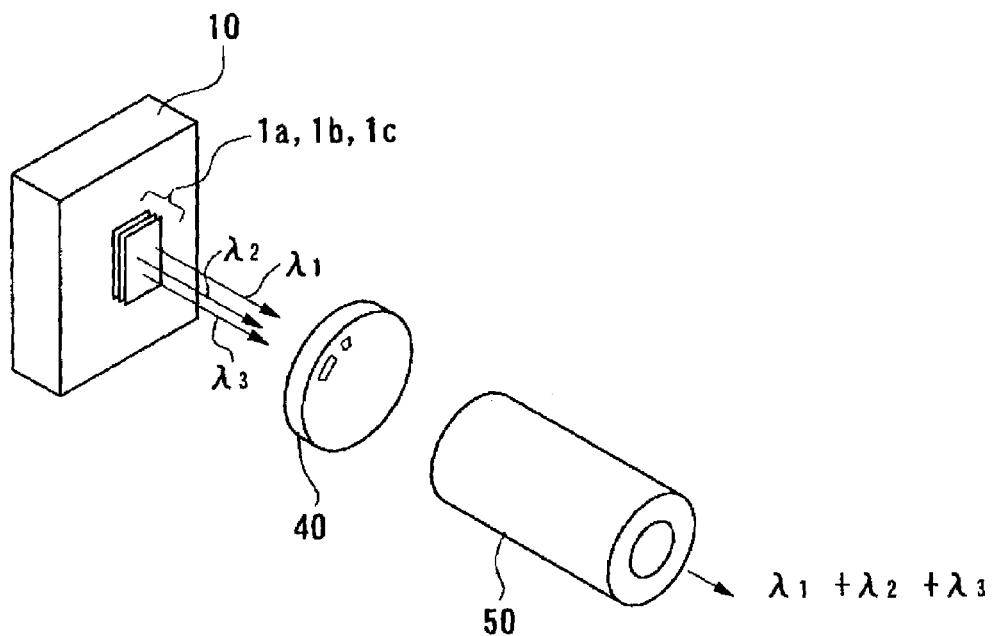
FIG. 9 is a perspective view of the main portion of a wavelength division multiplexing optical communication device using the semiconductor integrated circuit shown in FIG. 8.

Next, an example of applying the semiconductor integrated circuit shown in FIG. 8 is described below with reference to FIG. 9. FIG. 9 is a perspective view of the main portion of a wavelength division multiplexing (WDM) optical communication device (signal transmitting device) using the semiconductor integrated circuit shown in FIG. 8.

The wavelength division multiplexing (WDM) optical communication device includes a semiconductor integrated circuit that is formed using the substrate 10 and three tile-shaped microelements 1a, 1b, and 1c; one lens 40; and one optical fiber 50.

The tile-shaped microelements 1a, 1b, and 1c have respective surface emitting lasers for emitting laser beams having a wavelength of $\lambda_1$, $\lambda_2$, and $\lambda_3$. (The surface emitting lasers are not shown.) The laser beams having three different wavelengths ($\lambda_1$, $\lambda_2$, and $\lambda_3$) emitted from the tile-shaped microelements 1a, 1b, and 1c are focused by the lens 40 and are guided to the light-incident end of the optical fiber 50 and transmitted through the optical fiber 50.

By this, by modulating the laser beams having three different wavelengths $\lambda_1$, $\lambda_2$, and $\lambda_3$ using transmission signals, the wavelength division multiplexing (WDM) optical communication device can be formed. In the wavelength division multiplexing (WDM) optical communication device, a plurality of laser beams can enter one optical fiber by only using the lens 40, so that an optical multiplexer, which is required in a related art wavelength division multiplexing (WDM) optical communication device, is not required. Therefore, it is not necessary to align light-emitting sources and an optical multiplexer, thereby making the wavelength division multiplexing optical communication device easy to produce and smaller in size.

Figure 10:
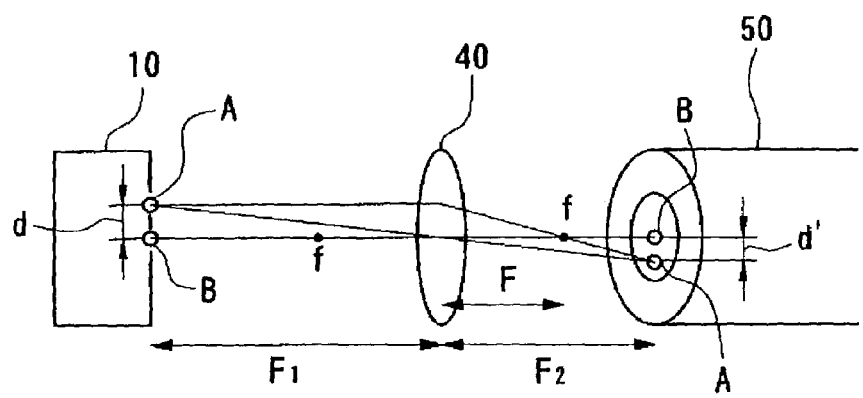
FIG. 10 is a schematic of an optical system of the wavelength division multiplexing optical communication device.

FIG. 10 is a schematic of an optical system including the lens 40, the substrate 10, and the optical fiber 50. The optical system is a reduction optical system. More specifically, when the distance between the tile-shaped microelements 1a, 1b, and 1c (bonded to the substrate 10) and the lens 40 is $F_1$, the distance between the lens 40 and the light-incident end of the optical fiber 50 is $F_2$, and the focal length of the lens 40 is F, the substrate 10, the lens 40, and the optical fiber 50 are arranged so that the following formula is established:

$$(F_1 \times F_2)/(F_1+F_2)=F$$

The magnification of the optical system with such an arrangement is $F_2/F_1$. If $F_1 > F_2$, the optical system becomes a reduction optical system.

Therefore, a distance d between a light-emitting point A, where the surface emitting laser on the tile-shaped microelement 1a is disposed, and a light-emitting point B, where the surface emitting laser on the tile-shaped microelement 1b is disposed, is reduced by the lens 40. Consequently, at the light-incident end surface of the optical fiber 50, a distance d' between a light-incident point A' and a light-incident point B' is provided.

The relationship between the distance d and the distance d' is d>d'.

This makes it possible for laser beams having different wavelengths to be introduced into a fiber having a small core diameter, such as a single mode fiber.

Next, a specific example of the semiconductor integrated circuit shown in FIG. 8 is described below with reference to FIG. 11. Like the semiconductor integrated circuit shown in FIG. 8, the semiconductor integrated circuit of this example is formed so that a tile-shaped microelement 1a, which radiates laser beams having a wavelength of $\lambda_2$, and a tile-shaped microelement 1b, which radiates laser beams having a wavelength of $\lambda_1$, are superimposed upon and bonded to each other.

The tile-shaped microelement 1a in the integrated semiconductor circuit includes a very-small tile-shaped section $21a_1$ and a light-emitting section $21a_2$. The tile-shaped microelement 1b includes a very-small tile-shaped section $21b_1$ and a light-emitting section $21b_2$. The very-small tile-shaped sections $21a_1$ and $21b_1$ function as lower multi-film reflective layers at surface emitting lasers, and the light-emitting sections $21a_2$ and $21b_2$ function as upper multi-film reflective layers and light-emitting layers. Therefore, the surface emitting lasers are formed by integrally forming the very-small tile-shaped sections $21a_1$ and $21b_1$ and their respective light-emitting sections $21a_2$ and $21b_2$.

For example, the very-small tile-shaped section $21b_1$ of the tile-shaped microelement 1b has a high reflectance ratio (equal to or greater than 99%; the higher the better) with respect to light having a wavelength of $\lambda_1$; has a low reflectance ratio (equal to or less than 10%; the lower the better) with respect to light having a wavelength of $\lambda_2$; and is formed of a material having a band gap that is larger than the wavelengths of $\lambda_1$ and $\lambda_2$.

This makes a point P2 at the very-small tile-shaped section $21b_1$ of the tile-shaped microelement 1b transparent to laser beams (having a wavelength of $\lambda_2$) emitted from the tile-shaped microelement 1a (that is, laser beams are not reflected or absorbed at the point P2), so that the laser beams having the wavelengths $\lambda_1$ and $\lambda_2$ are radiated upward from the tile-shaped microelement 1b.

For example, the very-small tile-shaped section $21a_1$ of the tile-shaped microelement 1a has a low reflectance ratio (equal to or less than 10%; the lower the better) with respect to light having a wavelength of $\lambda_1$; has a high reflectance ratio (equal to or greater than 99%; the higher the better) with respect to light having a wavelength of $\lambda_2$; and is formed of a material having a band gap that is larger than the wavelengths $\lambda_1$ and $\lambda_2$.

This makes a point P1 at the very-small tile-shaped section $21a_1$ of the tile-shaped microelement 1a transparent to laser beams (having a wavelength of $\lambda_1$) emitted from the tile-shaped microelement 1b(that is, laser beams are not reflected or absorbed at the point P1), so that the laser beams having the wavelengths of $\lambda_1$ and $\lambda_2$ are radiated downward from the tile-shaped microelement 1a.

Figure 11:
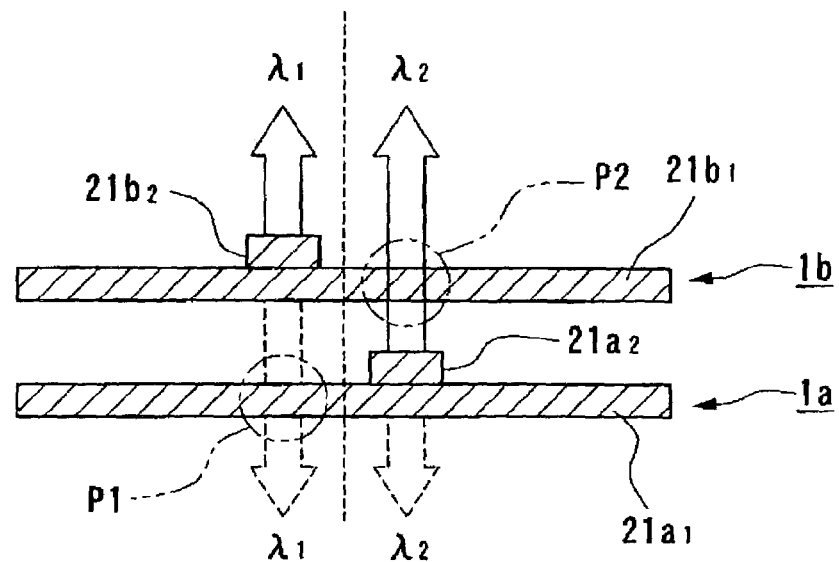
FIG. 11 is a schematic of the main portion of a specific example of the semiconductor integrated circuit.
Figure 12:
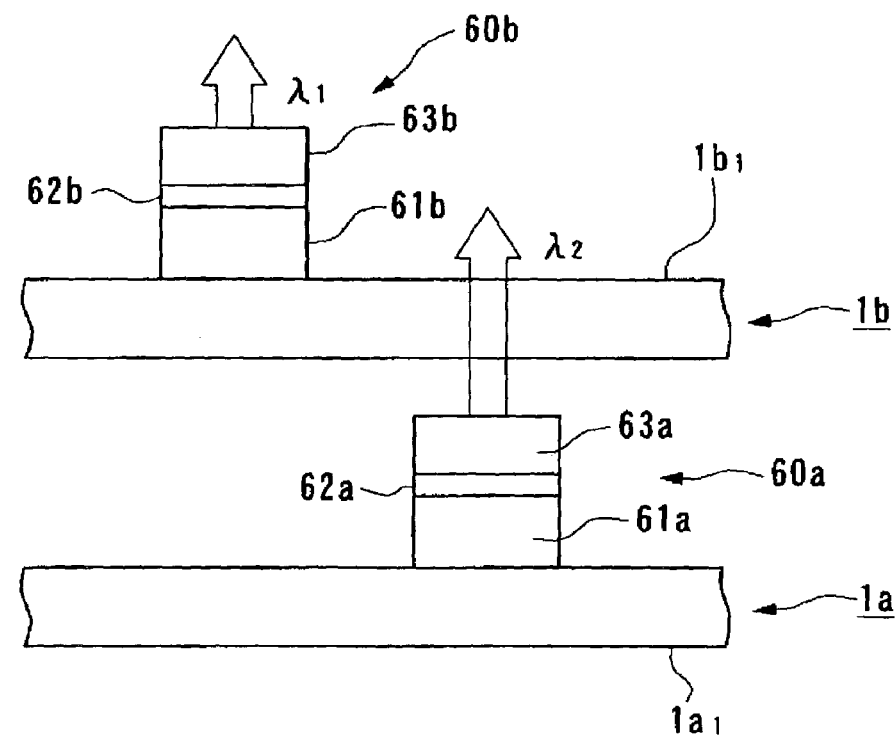
FIG. 12 is a schematic of the main portion of an exemplary modification of the semiconductor integrated circuit.

FIG. 12 illustrates a modification of the semiconductor integrated circuit shown in FIG. 11.

Like the semiconductor integrated circuit shown in FIG. 11, the modified semiconductor integrated circuit is formed so that a tile-shaped microelement 1a, which radiates laser beams having a wavelength of $\lambda_2$, and a tile-shaped microelement 1b, which radiates laser beams having a wavelength of $\lambda_1$, are superimposed upon and bonded to each other.

The tile-shaped microelement 1a in the semiconductor integrated circuit includes a very-small tile-shaped section $1a_1$ and a surface emitting laser section 60a. The tile-shaped microelement 1b comprises a very-small tile-shaped section $1b_1$ and a surface emitting laser section 60b.

The surface emitting laser sections 60a and 60b function as surface emitting lasers and comprise respective lower multi-film (lower diffraction grating) reflective layers 61a and 61b, respective light emitting layers (active layers) 62a and 62b, and respective upper multi-film (upper diffraction grating) reflective layers 63a and 63b. For example, the very-small tile-shaped sections $1a_1$ and $1b_1$ are formed as multi-film reflective layers acting as antireflection (transparent) layers with respect to wavelengths of $\lambda_1$ and $\lambda_2$. Therefore, the surface emitting laser sections 60a and 60b and the very-small tile-shaped sections $1a_1$ and $1b_1$ are functionally independent.

In the surface emitting laser section 60a of the tile-shaped microelement 1a, the lower diffraction grating reflective layer 61a and the upper diffraction grating reflective layer 63a each have a high reflectance ratio with respect to light having a wavelength of $\lambda_2$. In the surface emitting laser section 60b of the tile-shaped microelement 1b, the lower diffraction grating reflective layer 61b and the upper diffraction grating reflective layer 63b each have a high reflectance ratio with respect to light having a wavelength of $\lambda_1$.

By this, as in the semiconductor integrated circuit shown in FIG. 11, in this semiconductor integrated circuit, laser beams having wavelengths of $\lambda_1$ and $\lambda_2$ are radiated upward from the tile-shaped microelement 1b, and laser beams having wavelengths of $\lambda_1$ and $\lambda_2$ are radiated downward from the tile-shaped microelement 1a.

Exemplary Method of Producing a Tile-shaped Microelement

An exemplary method of producing the above-described tile-shaped microelements and the above-described semiconductor integrated circuits is described below with reference to FIGS. 13 to 22. Although, in the method, a compound semiconductor device, serving as a tile-shaped microelement, is adhered to a silicon/LSI chip including a substrate, the present invention may be applied regardless of the type of semiconductor device and LSI chip. In the exemplary embodiment, the term "semiconductor substrate" means any object formed of a semiconductor material. Its shape is not limited to a plate shape, so that an object of any shape can be referred to as a semiconductor substrate as long as it is formed of a semiconductor material.

First Step

Figure 13:
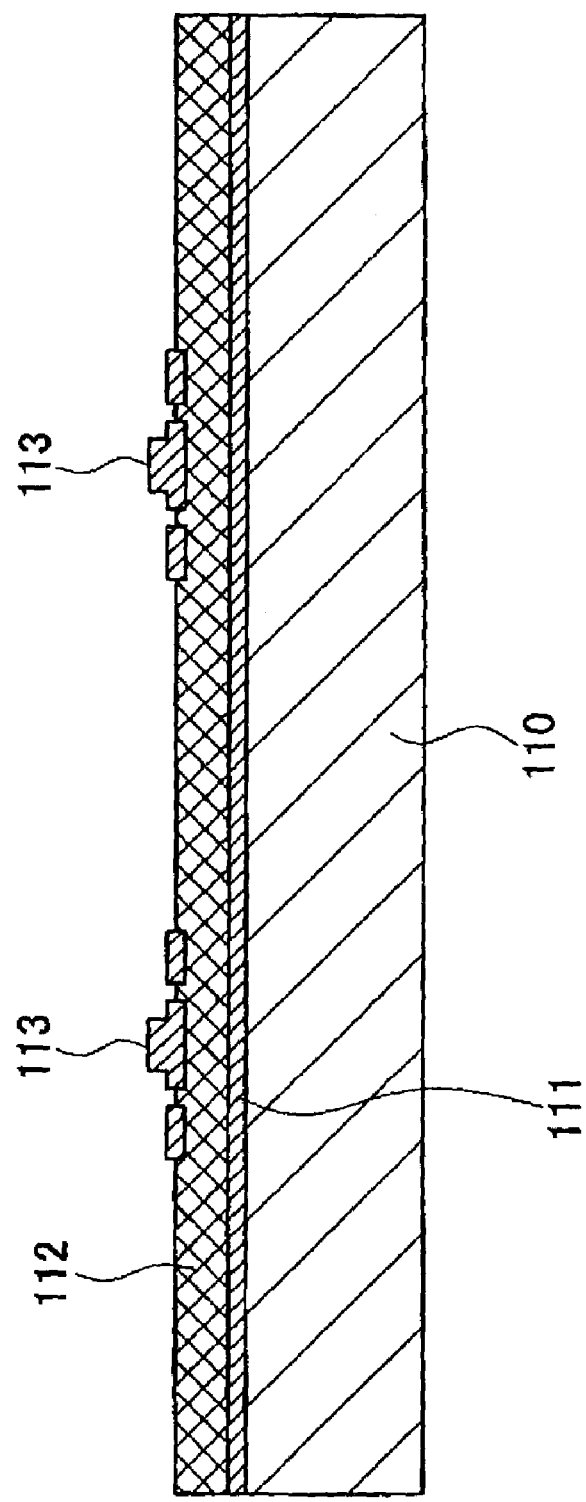
FIG. 13 is a schematic sectional view of a first step of a method of producing the semiconductor integrated circuits of the first and second exemplary embodiments.

FIG. 13 is a schematic sectional view showing a first step of the method of producing the semiconductor integrated circuit. In FIG. 13, a substrate 110 is a semiconductor substrate, such as a gallium arsenide compound semiconductor substrate. A sacrificial layer 111 is disposed as the lowest layer on the substrate 110, is formed of aluminum arsenide (AlAs), and has a thickness of, for example, a few hundred nanometers (nm).

For example, a functional layer 112 is disposed on top of the sacrificial layer 111. The functional layer 112 has a thickness of, for example, of the order of from 1 µm to 10 (20)µm. Semiconductor devices 113 are formed on the functional layer 112. For the semiconductor devices 113, a light-emitting diode (LED), a surface emitting laser (VC-SEL), a photodiode (PD), a high electron mobility transistor (HEMT), a hetero bipolar transistor (HBT), or the like, may be used. These semiconductor devices 113 are formed by stacking epitaxial layers on the substrate 110. An electrode is also formed in each of the semiconductor devices 113 and an operation test is carried out.

Second Step

Figure 14:
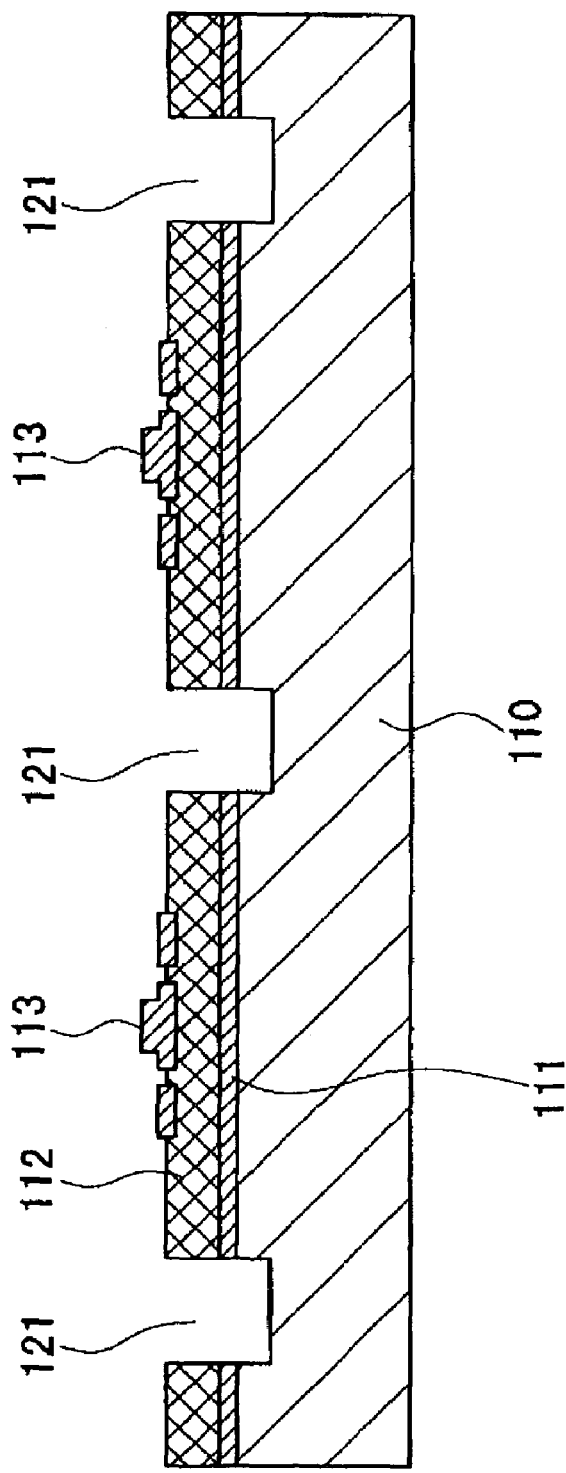
FIG. 14 is a schematic sectional view of a second step of the method.

FIG. 14 is a schematic sectional view showing a second step of the method of producing the semiconductor integrated circuit. In the step, grooves 121 are formed so as to separate the semiconductor devices 113 from each other. The grooves 121 each have a depth that is large enough to reach at least the sacrificial layer 111. For example, the width and depth of each groove is from 10 micrometers (µm) to a few hundred micrometers (µm). Each groove 121 is continuous without an end so that a selective etchant (described later) flows in each groove 121. It is desirable that the grooves 121 be in the form of a lattice as in a go board.

By making the distance between adjacent grooves 121 from a few tens of micrometers (µm) to a few hundred micrometers (µm), the semiconductor devices 113 that are separated from each other by the grooves 121 each have an area of from a few tens of micrometers (µm) square to a few hundred micrometers (µm) square. The grooves 121 may be formed by photolithography and wet etching or dry etching. The grooves 121 may be formed with U shapes by dicing as long as cracks are not produced in the substrate.

Third Step

Figure 15:
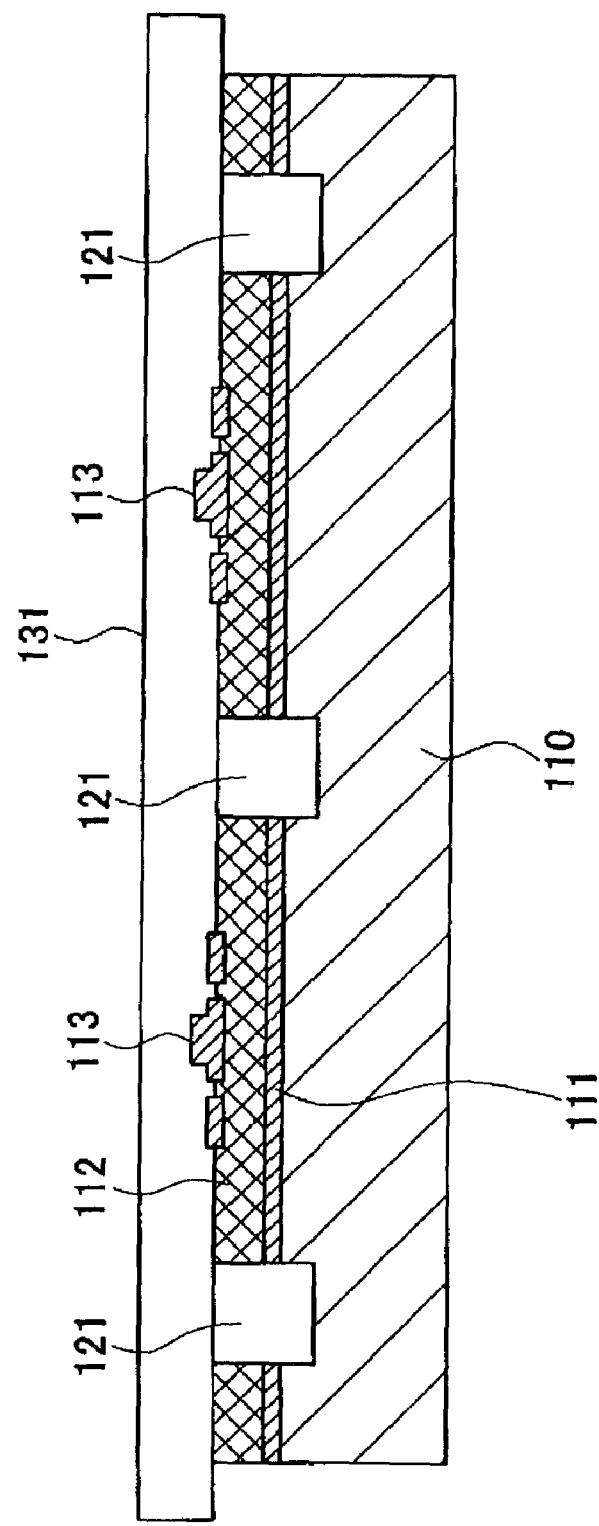
FIG. 15 is a schematic sectional view of a third step of the method.

FIG. 15 is a schematic sectional view showing a third step of the method of producing the semiconductor integrated circuit. In this step, an intermediate transfer film 131 is affixed to a surface, disposed at the side of the semiconductor devices 113, of the substrate 110. The intermediate transfer film 131 is a flexible film with an adhesive applied to its surface.

Fourth Step

Figure 16:
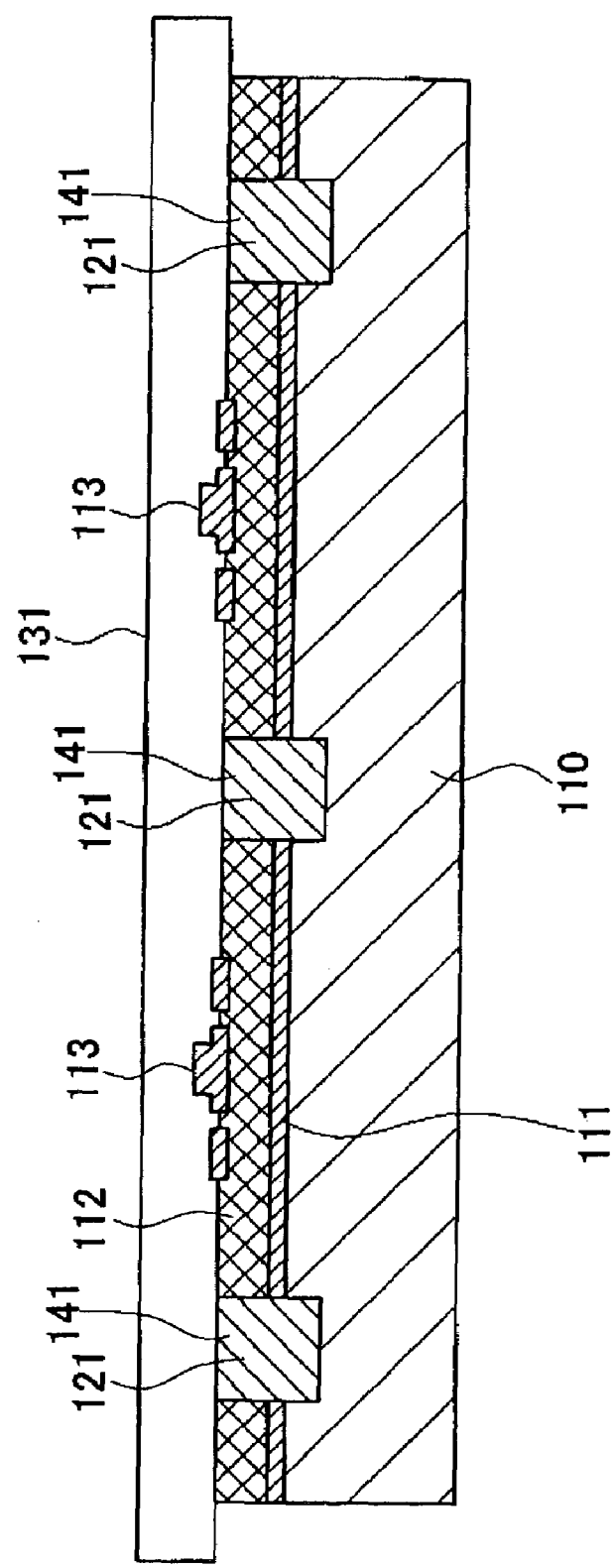
FIG. 16 is a schematic sectional view of a fourth step of the method.

FIG. 16 is a schematic sectional view showing a fourth step of the method of producing the semiconductor integrated circuit. In this step, a selective etchant 141 is poured into the grooves 121. In order to selectively etch only the sacrificial layer 111, hydrochloric acid having high selectivity with respect to aluminum arsenide and having a low concentration is used as the selective etchant 141.

Fifth Step

Figure 17:
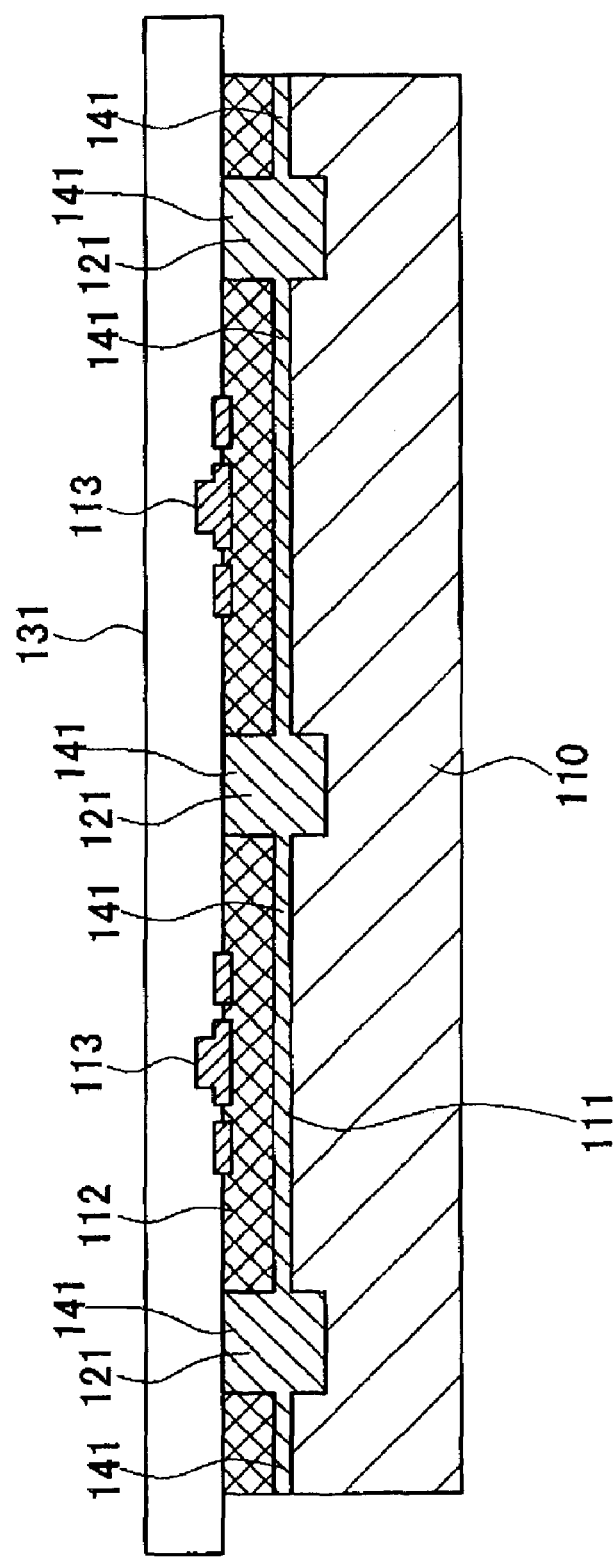
FIG. 17 is a schematic sectional view of a fifth step of the method.

FIG. 17 is a schematic sectional view showing a fifth step of the method for producing the semiconductor integrated circuit. In this step, when a predetermined period of time has elapsed after the pouring of the selective etchant 141 into the grooves 121, the whole sacrificial layer 111 is selectively etched and removed from the substrate 110.

Sixth Step

Figure 18:
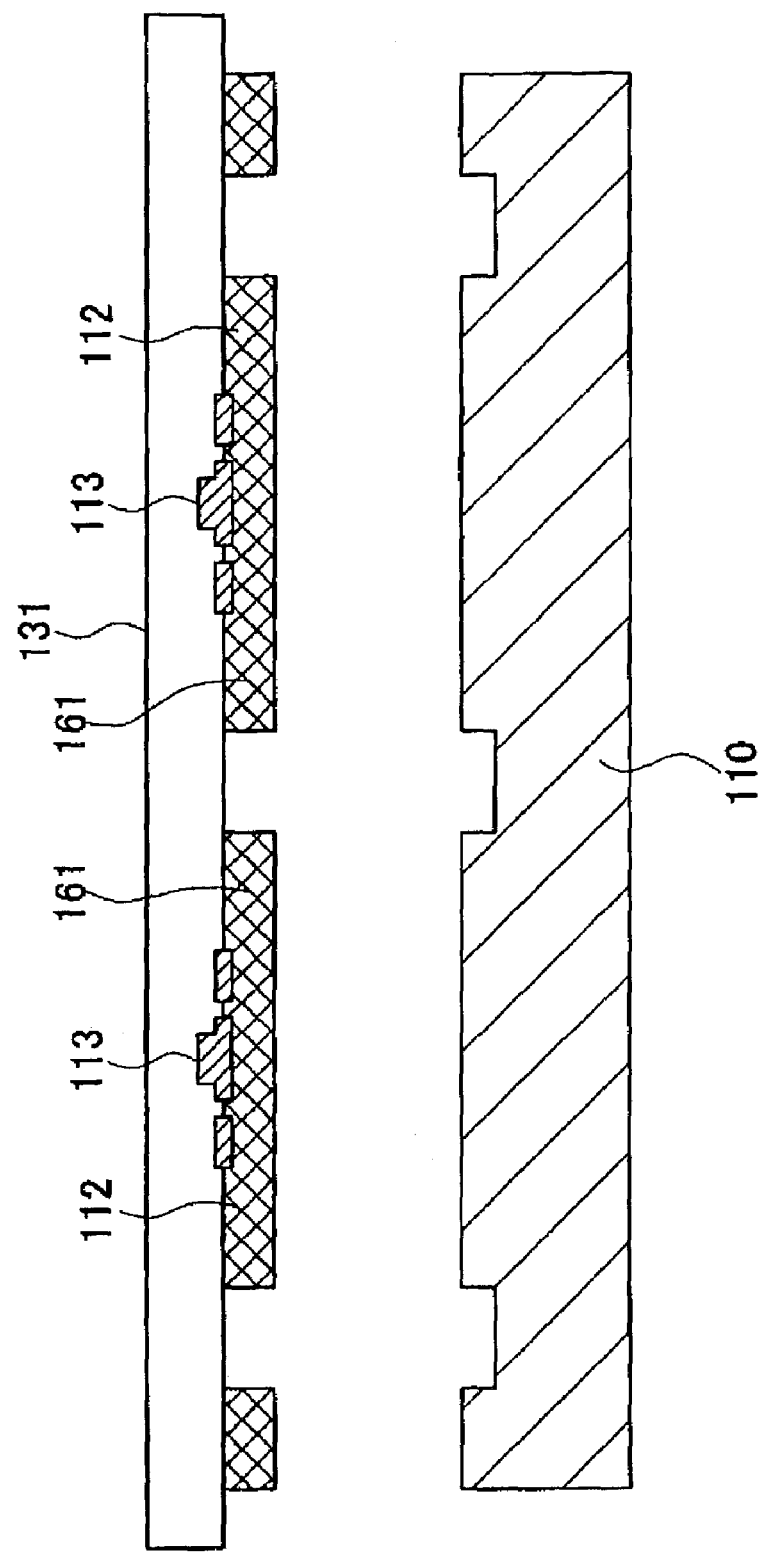
FIG. 18 is a schematic sectional view of a sixth step of the method.

FIG. 18 is a schematic sectional view showing a sixth step of the method of producing the semiconductor integrated circuit. When the whole sacrificial layer 111 has been etched in the fifth step, the functional layer 112 is separated from the substrate 110. In the sixth step, by separating the intermediate transfer film 131 from the substrate 110, the functional layer 112 that is adhered to intermediate transfer film 131 is separated from the substrate 110.

By this, the functional layer 112 having the semiconductor devices 113 formed thereon is divided by forming grooves 121 and by etching the sacrificial layer 111, so that semiconductor devices having a predetermined shape (for example, the shape of a very-small tile) are formed, and are adhered to and held by the intermediate transfer film 131. (The semiconductor devices are called "tile-shaped microelements" in the aforementioned exemplary embodiments.) It is desirable that the functional layer have a thickness of the order of, for example, from 1 µm to 10 µm, and horizontal and vertical sizes of, for example, from a few tens of micrometers (µm) to a few hundred micrometers (µm).

Seventh Step

Figure 19:
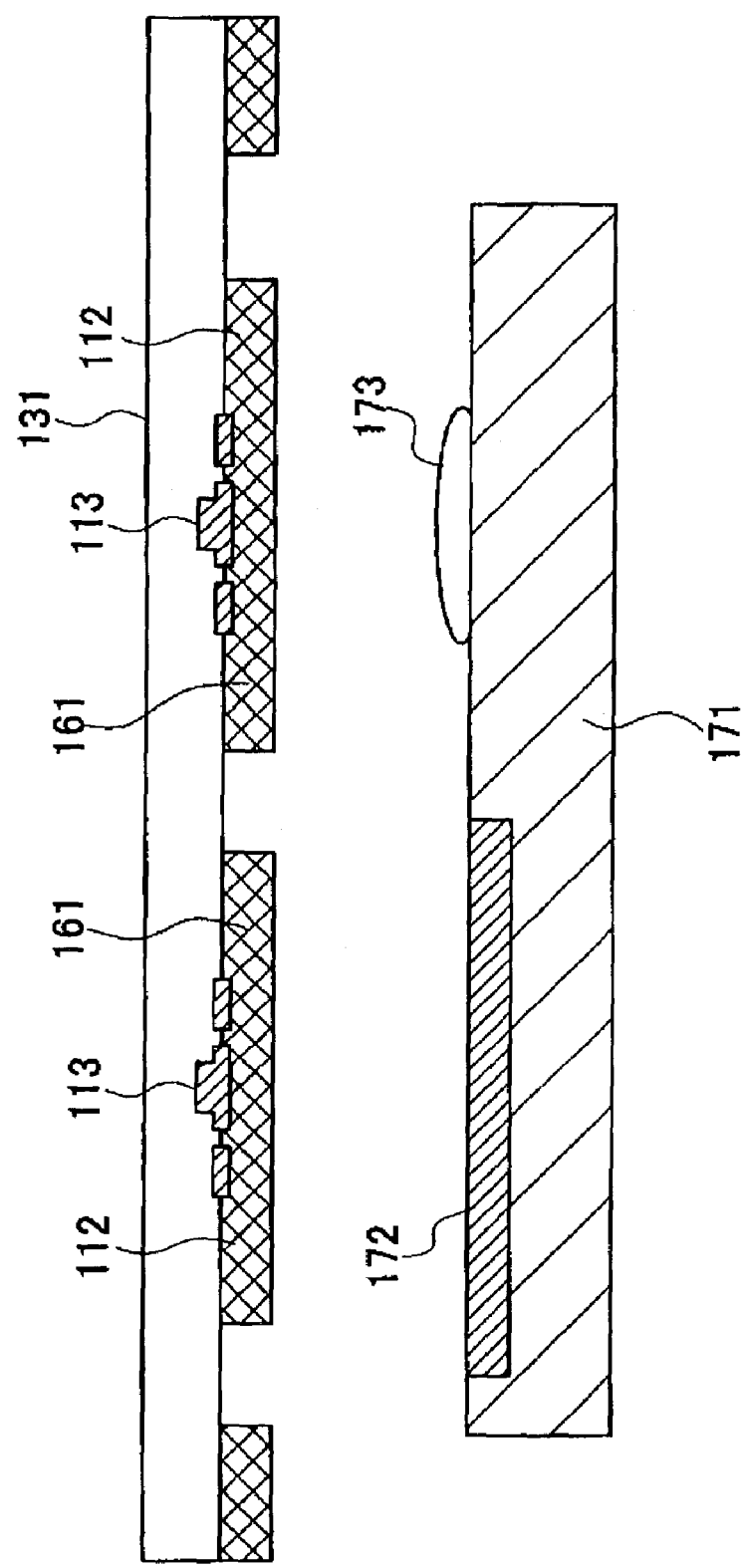
FIG. 19 is a schematic sectional view of a seventh step of the method.

FIG. 19 is a schematic sectional view showing a seventh step of the method of producing the semiconductor integrated circuit. In this step, by moving the intermediate transfer film 131 (having tile-shaped microelements 161 affixed thereto), one of the tile-shaped microelements 161 is aligned with a desired position of a final substrate 171. Here, the final substrate 171 is, for example, a silicon substrate and has an LSI area 172. An adhesive 173 to adhere the tile-shaped microelement 161 is applied to the desired location of the final substrate 171. The adhesive may be applied to the tile-shaped microelement.

Eighth Step

Figure 20:
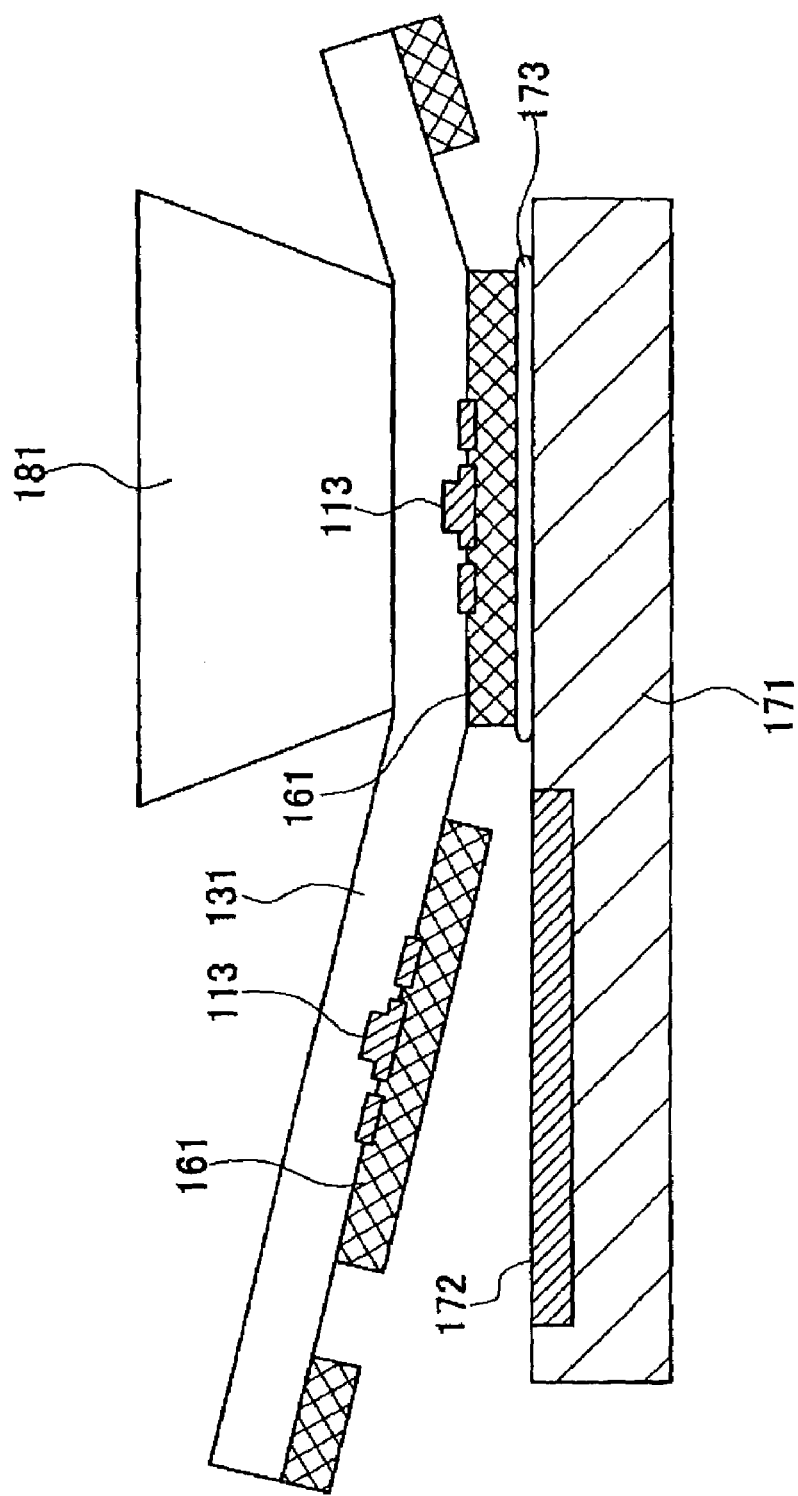
FIG. 20 is a schematic sectional view of an eighth step of the method.

FIG. 20 is a schematic sectional view showing an eighth step of the method of producing the semiconductor integrated circuit. In this step, the tile-shaped microelement 161 that has been aligned with the desired location of the final substrate 171 is pushed against and joined to the final substrate 171 through the intermediate transfer film 131. Here, since the adhesive 173 is applied to the desired location, the tile-shaped microelement 161 is adhered to the desired location of the final substrate 171.

Ninth Step

Figure 21:
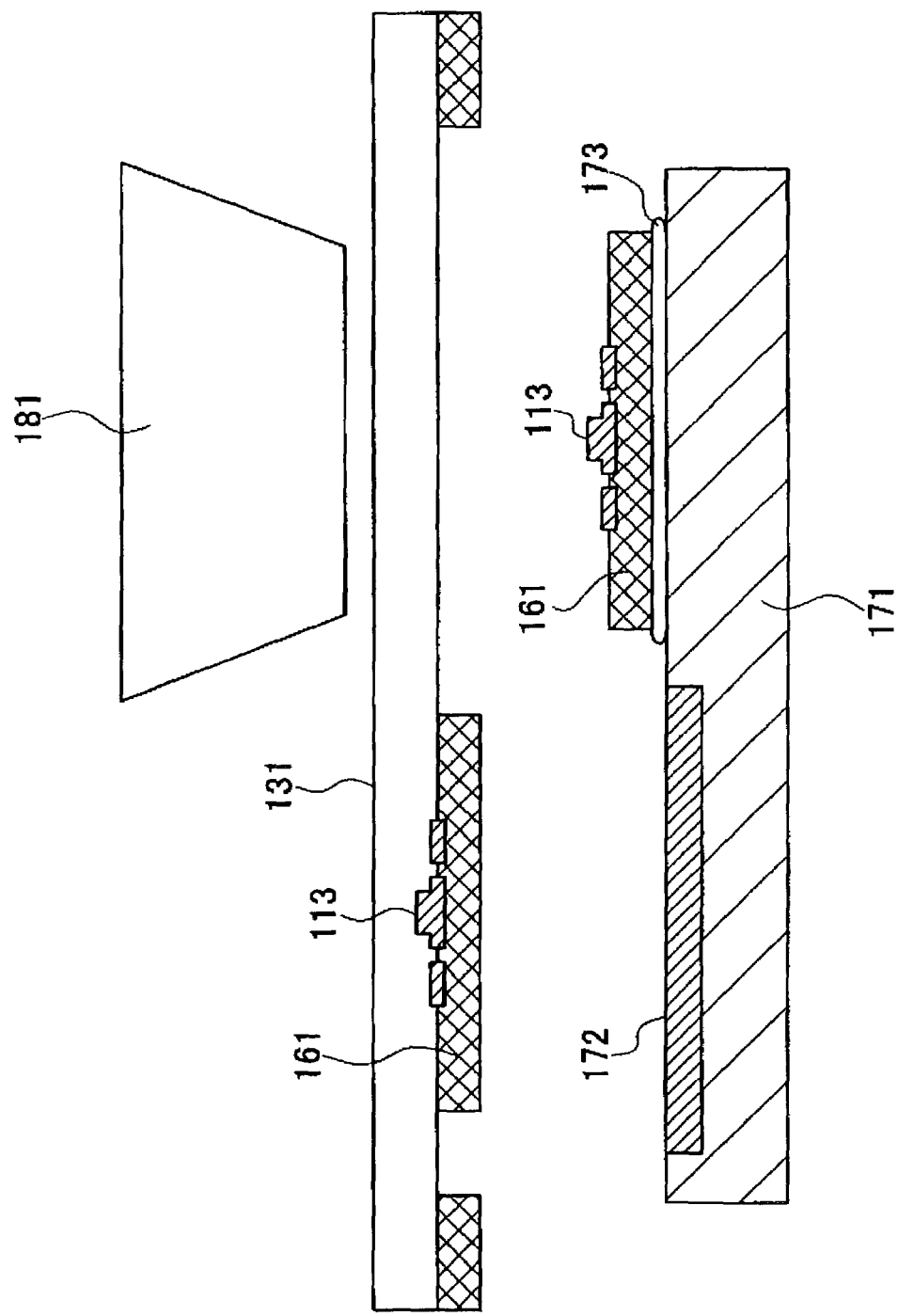
FIG. 21 is a schematic sectional view of a ninth step of the method.

FIG. 21 is a schematic sectional view showing a ninth step of the method of producing the semiconductor integrated circuit. In this step, the adhesive force of the intermediate transfer film 131 is lost, and the intermediate transfer film 131 is peeled off from the tile-shaped microelement 161.

The adhesive on the intermediate transfer film 131 is a UV curing adhesive or a thermosetting adhesive. If a UV curing adhesive is used, the back pressing pin 181 is formed of a transparent material, so that, by irradiating the intermediate transfer film 131 with ultraviolet light (UV) from an end of the back pressing pin 181, the adhesive force of the intermediate transfer film 131 is lost. In contrast, if a thermosetting adhesive is used, the back pressing pin 181 may be heated or, after the sixth step, the entire intermediate transfer film 131 may be irradiated with, for example, ultraviolet light in order to remove the adhesive force from the entire surface thereof. Here, not all of the adhesive force is lost, so that there is actually a small amount of adhesive force left. Accordingly, since the tile-shaped microelements 161 are very thin and light, the other tile-shaped microelements 161 are held by the intermediate transfer film 131.

Tenth Step

This step is not illustrated. In this step, heating or the like is carried out in order to permanently join the tile-shaped microelement 161 to the final substrate 171.

Eleventh Step

Figure 22:
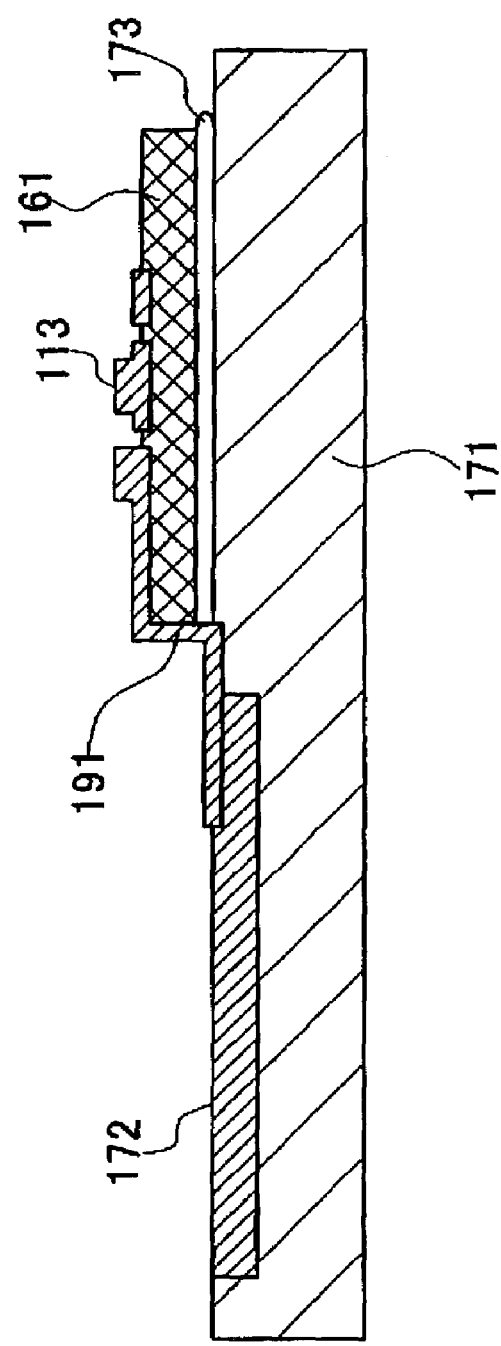
FIG. 22 is a schematic sectional view of an eleventh step of the method.

FIG. 22 is a schematic sectional view showing an eleventh step of the method of producing the semiconductor integrated circuit. In this step, the electrode of the tile-shaped microelement 161 is electrically coupled to a circuit on the final substrate 171 by a wiring 191, so that the semiconductor integrated circuit of, for example, one LSI chip is completed. The final substrate 171 may be a glass substrate, a quartz substrate, or a plastic film, in addition to a silicon semiconductor substrate.

Twelfth Step

In this step, as shown in FIG. 1, by performing the eleventh step shown in FIG. 22, a tile-shaped microelement is superimposed upon and bonded to the top surface of the tile-shaped microelement 161 that has been formed on the final substrate 171. The tile-shaped microelement is adhered by repeating the aforementioned first to eleventh steps.

By this, it is possible to more easily and quickly superimpose and adhere a plurality of tile-shaped microelements on a predetermined substrate.

Applications

Hereunder, a description of exemplary applications of the semiconductor integrated circuit of the present invention is provided.

In a first type of application, the semiconductor integrated circuit of the first exemplary embodiment is used as an optoelectronic integrated circuit. More specifically, as the integrated circuit of the first exemplary embodiment, this integrated circuit may include a light emitter (surface emitting laser) and a light receiver (photodiode), which are superimposed upon and adhered to each other, and an outputting device using an APC circuit and using light. Alternatively, as in the second exemplary embodiment, it may include a light-emitting device (outputting device) in which a plurality of light emitters, which have different light-emission wavelengths, are superimposed upon and adhered to each other. Alternatively, it may include a light-receiving device (inputting device) in which a plurality of light receivers, which selectively detect light having different wavelengths, are superimposed upon and adhered to each other.

Using any one of these integrated circuits, for example, a computer is formed. Signal processing in the integrated circuit forming a central processing unit (CPU) is carried out using electric signals. An input/output device using light is used in a bus to transmit data between, for example, the CPU and a storage device.

By this, according to this application of the semiconductor integrated circuit, signal transmission speed in a bus, which is a bottleneck in computer processing speed, can be considerably increased than that in related art semiconductor integrated circuits.

In addition, according to this application of the semiconductor integrated circuit, since the tile-shaped microelements are superimposed upon each other, it is possible to considerably reduce the size of a computer or the like.

Further, according to this application, since a surface emitting laser with an APC circuit is used for the input/output device forming the bus, it is possible to stably maintain the high performance state of the integrated circuit for a long period of time.

In a second type of application, for every pixel of a liquid crystal display, a plasma display, or an organic electroluminescence (EL) display (which are electro-optical devices), it is possible to superimpose and adhere tile-shaped microelements, having, for example, a silicon transistor, resistor, or capacitor, instead of, for example, a thin-film transistor (TFT), which is usually used as a driving transistor, a resistor, or a capacitor, in order to form the semiconductor integrated circuit of the first exemplary embodiment.

Therefore, according to this application, compared to the case where a TFT is used, it is possible to provide an electro-optical device which can provide a highly efficient switching function and which can change a display state with high speed.

Exemplary Electronic Apparatus

An example of an electro-optical apparatus including the above-described semiconductor integrated circuit of either exemplary embodiment or any one of the aforementioned types of electro-optical devices is described below.

Figure 23:
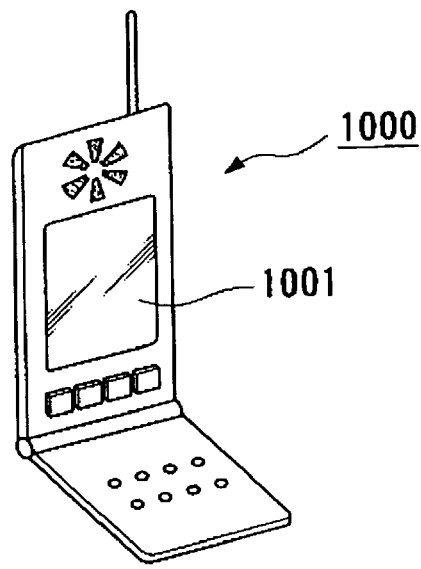
FIG. 23 illustrates an example of an electronic apparatus including an electro-optical device.

FIG. 23 is a perspective view of a cellular phone. In FIG. 23, reference numeral 1000 denotes the body of the cellular phone using any one of the above-described semiconductor integrated circuits, and reference numeral 1001 denotes a display using any of the aforementioned types of electro-optical devices.

Figure 24:
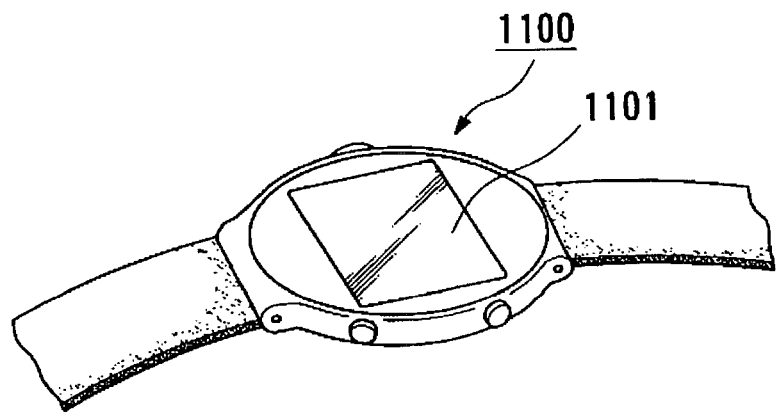
FIG. 24 illustrates an example of another electronic apparatus including an electro-optical device.

FIG. 24 is a perspective view of a wristwatch. In FIG. 24, reference numeral 1100 denotes a timepiece body using any one of the above-described semiconductor integrated circuits, and reference numeral 1101 denotes a display using any of the aforementioned types of electro-optical devices.

Figure 25:
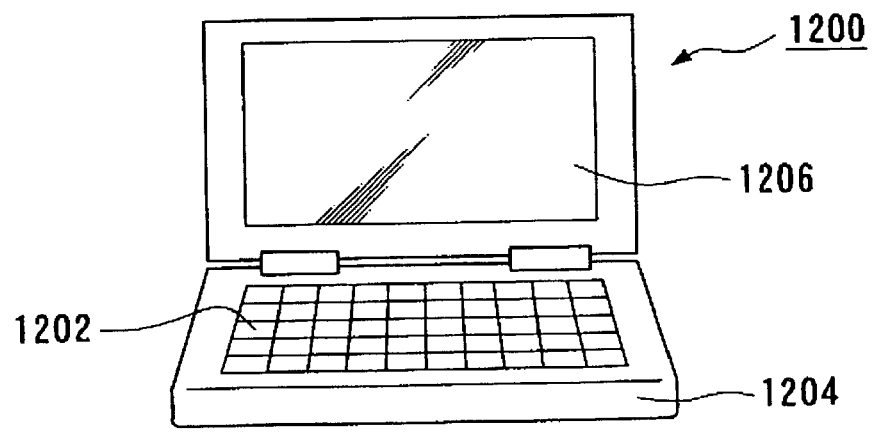
FIG. 25 illustrates an example of still another electronic apparatus including an electro-optical device.

FIG. 25 is a perspective view of a portable information processor, such as a word processor or a personal computer. In FIG. 25, reference numeral 1200 denotes the information processor; reference numeral 1202 denotes an input section, such as a keyboard; reference numeral 1204 denotes an information processor body using any one of the above-described semiconductor integrated circuits; and reference numeral 1206 denotes a display using any of the aforementioned types of electro-optical devices.

Since the electronic apparatuses shown in FIGS. 23 to 25 each include the semiconductor integrated circuit of either exemplary embodiment or any one of the types of electro-optical devices, it is possible to provide electronic apparatuses including a display that has excellent display quality, in particular, a display that is bright and that provides high-speed response. In addition, by using the semiconductor integrated circuit of either exemplary embodiment, it is possible to provide an electronic apparatus that is smaller and that can be produced at a lower cost than a related electronic apparatus.

The technical scope of the present invention is not limited to the above-described exemplary embodiments. Various changes may be made within a scope not departing from the spirit and scope of the present invention. The specific materials, layer structures, etc., in the exemplary embodiments are merely examples, so that they may be changed when necessary.

For example, although, in the exemplary embodiments, the two tile-shaped microelements that are superimposed upon and adhered to each other are disposed parallel to each other, they may be obliquely adhered to each other at a desired angle.

Although, in the exemplary embodiments, the two tile-shaped microelements are adhered to each other so that one entire surface of one tile-shaped microelement and one entire surface of the other tile-shaped microelement are superimposed upon each other, they may be adhered to each other so that a portion of one surface of one tile-shaped microelement and a portion of one surface of the other tile-shaped microelement are superimposed upon each other. Such a structure may be used in the second exemplary embodiment, in which case the two tile-shaped microelements have light emitters having different light-emission wavelengths and the light emission axis of one of the tile-shaped microelement and the light emission axis of the other tile-shaped microelement do not coincide.

In the exemplary embodiments where a plurality of tile-shaped microelements having light emitters with different light emission wavelengths are used, although light is emitted in the same direction, it may be emitted in different directions.

The adhesive, non-transparent material, and transparent protective layer may be formed by a drop discharge method of discharging liquids including the adhesive, the nontransparent material, and the transparent protective material from an inkjet device. This makes it possible to considerably reduce the amount of adhesive, nontransparent material, and transparent protective material used in producing a semiconductor integrated circuit and to reduce production costs and production time.

Advantages

As is clear from the foregoing description, according to the present invention, since a plurality of tile-shaped microelements are adhered to each other, it is possible to compactly integrate a plurality of devices.

What is claimed is:

1. A semiconductor integrated circuit, comprising:
   a substrate;
   a first microelement disposed on and adhered to the substrate with a first adhesive; and
   a second microelement disposed on and adhered to the first microelement with a second adhesive, the second adhesive covering the first microelement and directly contacting at least a part of the substrate and at least a part of the first adhesive.

2. The semiconductor integrated circuit according to claim 1, the adhesive being at least one of insulative and transparent.

3. The semiconductor integrated circuit according to claim 1, the first microelement functioning differently from the second microelement.

4. The semiconductor integrated circuit according to claim 3, the first microelement being a light emitter, and the second microelement being a light receiver.

5. The semiconductor integrated circuit according to claim 1;
   the first microelement being a light emitter; and
   the second microelement being a light receiver and disposed on an emission axis on which a light emitted by the first microelement propagates.

6. The semiconductor integrated circuit according to claim 1;
   the first microelement being a light emitter; and
   the second microelement being a light receiver, receiving a portion of light from the first microelement, and detecting the amount of received light.

7. The semiconductor integrated circuit according to claim 1;
   the first microelement being a light emitter;
   the second microelement being a light receiver; and
   further comprising an automatic power control circuit that controls the amount of light emitted from the first microelement based on the amount of received light detected by the second microelement.

8. The semiconductor integrated circuit according to claim 1;
   the first microelement being a light emitter; and
   the second microelement being a light receiver, and having a multi-film reflective layer disposed on at least one surface thereof.

9. The semiconductor integrated circuit according to claim 1, the first microelement and the second microelement being light emitters having different emission wavelengths.

10. An electro-optical device, comprising:
    the semiconductor integrated circuit of claim 1.

11. An electronic apparatus, comprising:
    the electro-optical device of claim 10.

12. An electronic apparatus, comprising:
    the semiconductor integrated circuit of claim 1.

13. The semiconductor integrated circuit according to claim 1, further comprising:
    a wiring that connects the first microelement to an electronic circuit contacting the substrate and the first adhesive.

14. A semiconductor integrated circuit, comprising:
    a substrate;
    a first microelement disposed on the substrate, the first microelement being a light emitter; and
    a second microelement disposed on the first microelement, the second microelement being a light receiver, and having a multi-film reflective layer disposed on at least one surface thereof, the reflectance ratio of the multi-film reflective layer of the second microelement with respect to the light from the first microelement being equal to or less than 10%.

15. A semiconductor integrated circuit, comprising:
    a substrate; and
    a plurality of microelements that are superimposed upon the substrate, at least one of the plurality of microelements being a light emitter, and at least one other of the plurality of microelements being a light receiver disposed on the at least one light emitter, wherein a surface of the at least one light receiver, opposite to a light-receiving surface of the at least one light receiver, is covered with a non-transparent material.

16. The semiconductor integrated circuit according to claim 15, the substrate being a transparent substrate, the at least one light emitter being a surface emitting laser affixed to a top surface of the transparent substrate with a transparent adhesive, the at least one light receiver being a photodiode adhered to the top surface of the at least one surface emitting laser with a transparent adhesive, and the non-transparent material covering the top surface of the at least one photodiode.

17. The semiconductor integrated circuit according to claim 15, the substrate being a transparent substrate, the at least one light receiver being a photodiode affixed to the top surface of the transparent substrate with a transparent adhesive, the at least one surface light emitter being an emitting laser adhered to the top surface of the at least one photodiode with a transparent adhesive, and a non-transparent material covering the top surface of the at least one surface emitting laser.

18. A semiconductor integrated circuit, comprising:
    a substrate;
    a first microelement disposed on and adhered to the substrate with a first adhesive; and
    a second microelement disposed on and adhered to the first microelement with a second adhesive, the second adhesive covering the first microelement and contacting the substrate and the first adhesive, the first microelement and the second microelement being light emitters having different emission wavelengths, the light emitters being surface emitting lasers, and being disposed so that the optical axes of the surface emitting lasers do not coincide.

19. The semiconductor integrated circuit according to claim 18, the first microelement and the second microelement each including a laser structural section, which functions as the surface emitting laser, and a tile-shaped section, which is joined to the laser structural section, and the tile-shaped section of each of the first microelement and the second microelement being transparent to light from the surface emitting laser of another microelement.

20. The semiconductor integrated circuit according to claim 18, the first microelement and the second microelement each including a laser structural section, which functions as the surface emitting laser, and a tile-shaped section, which is joined to the laser structural section, and the tile-shaped section of each of the first microelement and the second microelement being transparent to light from the surface emitting laser of the same microelement.

21. A signal transmitting device, comprising:
the semiconductor integrated circuit of claim 18;
a lens that focuses light emitted from the surface emitting lasers disposed in the semiconductor integrated circuit; and
an optical fiber upon which emitted light focused by the lens impinges.

22. The signal transmitting device according to claim 21, wherein a reduction optical system with respect to the emitted light includes the semiconductor integrated circuit, the lens, and the optical fiber arranged in terms of the focal length of the lens.

* * * * *